United States Patent [19]
Toda

[11] Patent Number: 5,862,097
[45] Date of Patent: Jan. 19, 1999

[54] SEMICONDUCTOR MEMORY DEVICE

[75] Inventor: Haruki Toda, Yokohama, Japan

[73] Assignee: Kabushiki Kaisha Toshiba, Tokyo, Japan

[21] Appl. No.: 967,575

[22] Filed: Nov. 10, 1997

[30] Foreign Application Priority Data

Nov. 11, 1996 [JP] Japan ..................................... 8-298776

[51] Int. Cl.$^6$ .............................. G11C 8/00; G11C 16/04; G11C 7/00
[52] U.S. Cl. ................. 365/230.03; 365/230.06; 365/189.05; 365/200; 365/225.7
[58] Field of Search ......................... 365/230.03, 230.06, 365/230.08, 189.05, 200, 207, 208, 225.7

[56] References Cited

U.S. PATENT DOCUMENTS

| | | | |
|---|---|---|---|
| 5,699,289 | 12/1997 | Takenaka | 365/230.03 |
| 5,732,030 | 3/1998 | Dorney | 365/200 |
| 5,740,120 | 4/1998 | Okamura | 365/230.03 |

*Primary Examiner*—David Nelms
*Assistant Examiner*—Trong Phan
*Attorney, Agent, or Firm*—Loeb & Loeb LLP

[57] ABSTRACT

It is an object of this invention to provide a semiconductor memory device in which a failure can be efficiently remedied even for a larger number of bits. In a multi-bit memory capable of simultaneously exchanging a plurality of data upon reception of an address, spare DQ lines (15c) commonly used for each I/O, a spare sense amplifier circuit (13c), a spare column switch (14c), a fuse box (20) for storing the address of a DQ line in which a failure has occurred, and fuse circuits (21-1, 21-2, . . . ) for storing an I/O to which the failure-DQ line belongs are arranged to remedy the failure for each I/O. Since only a memory cell belonging to one I/O where a failure has occurred is replaced, unnecessary replacement is not executed, and the memory cell can be efficiently remedied even for a larger number of bits.

13 Claims, 16 Drawing Sheets

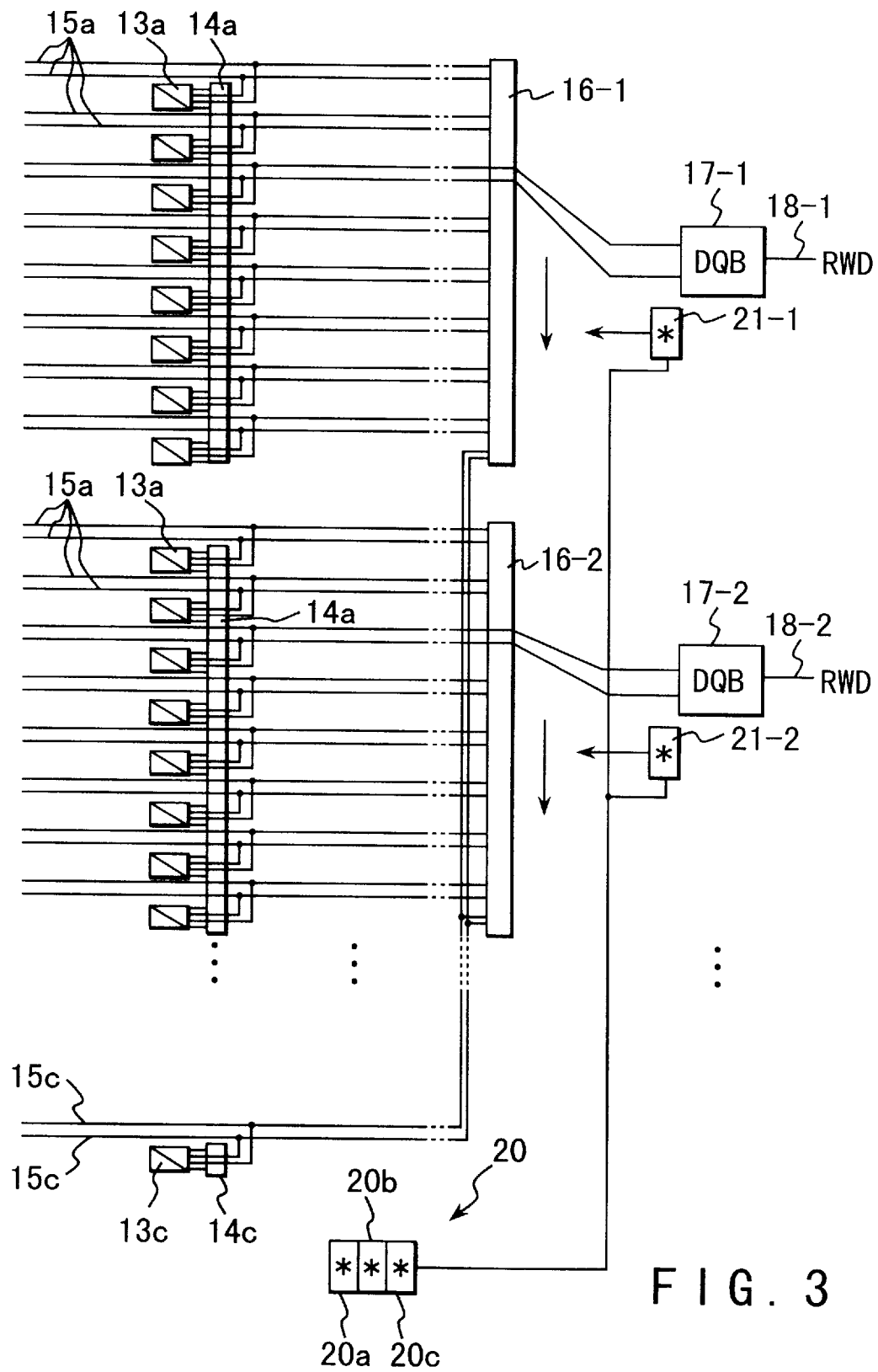
F I G. 3

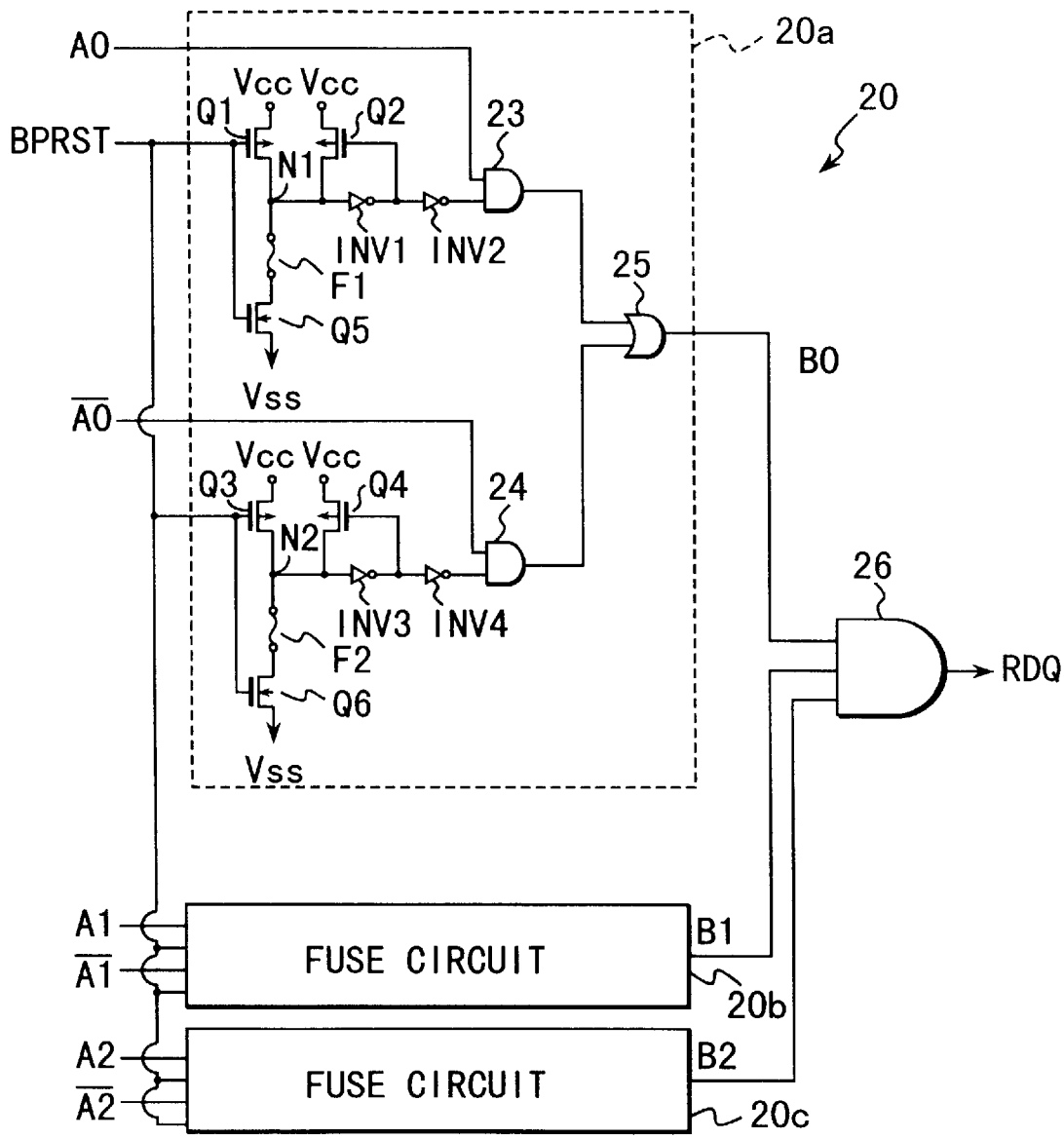
F I G. 4

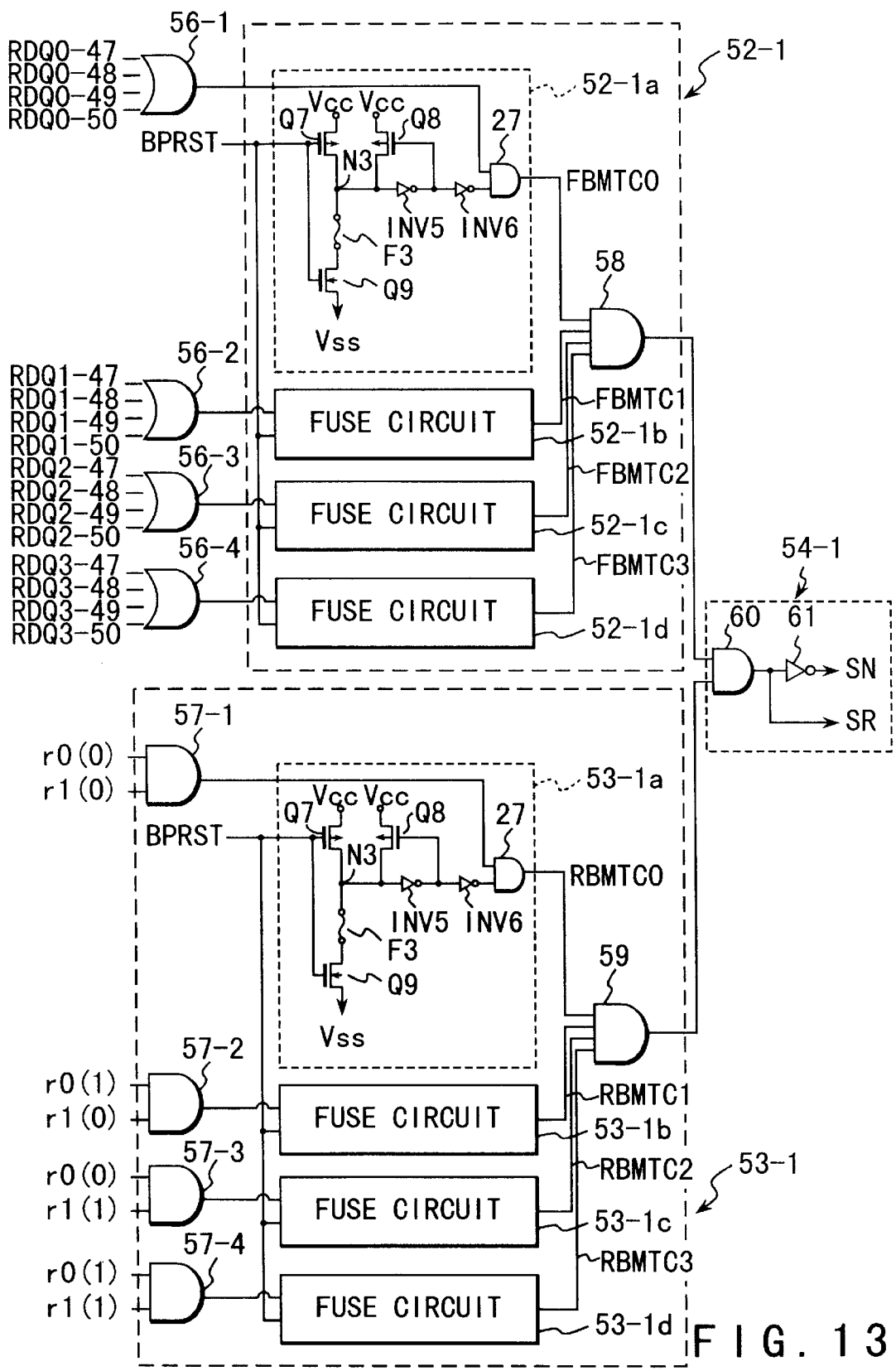
F I G. 13

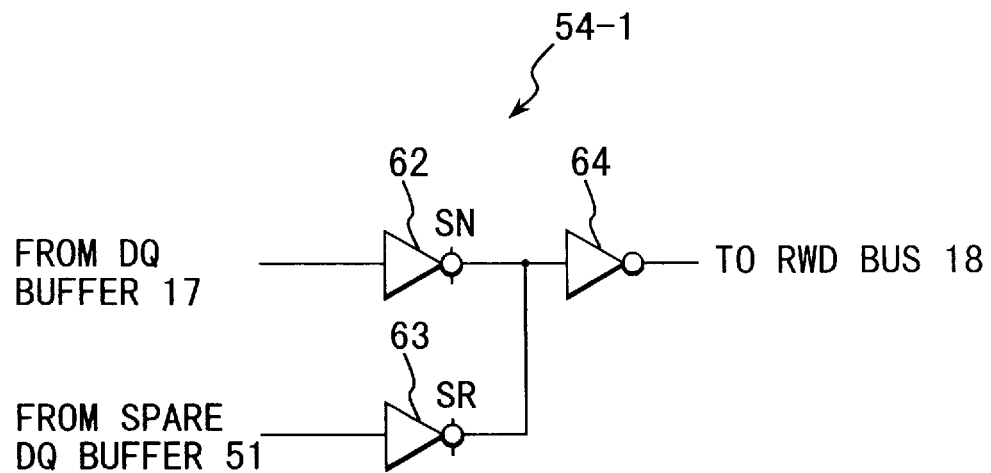
F I G. 1 4
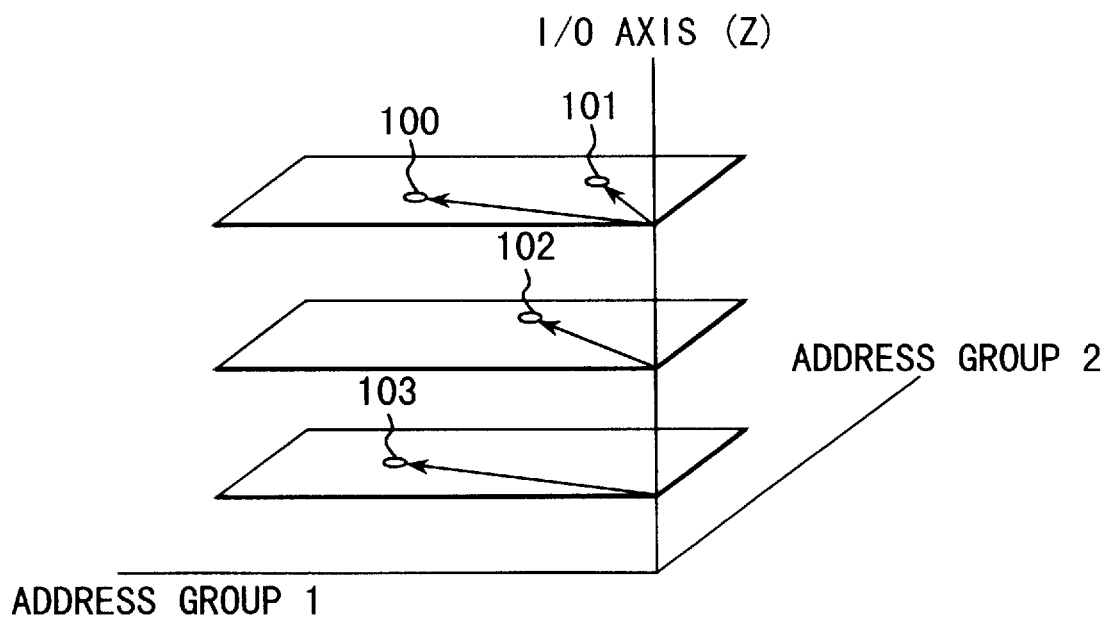
F I G. 1 5

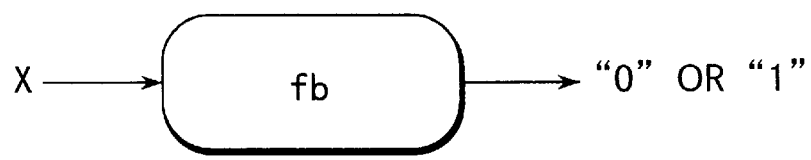
F I G. 16
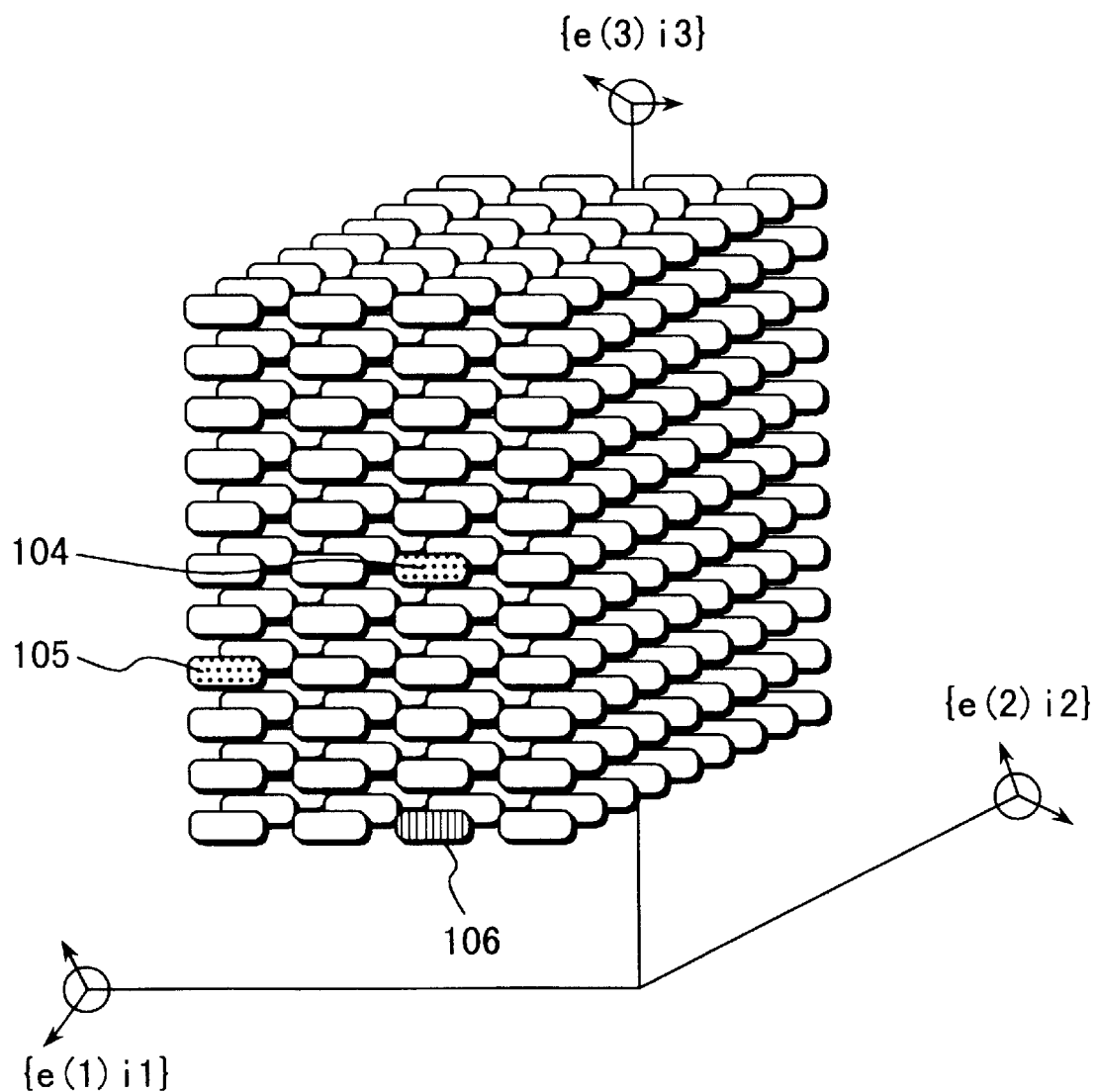
F I G. 17

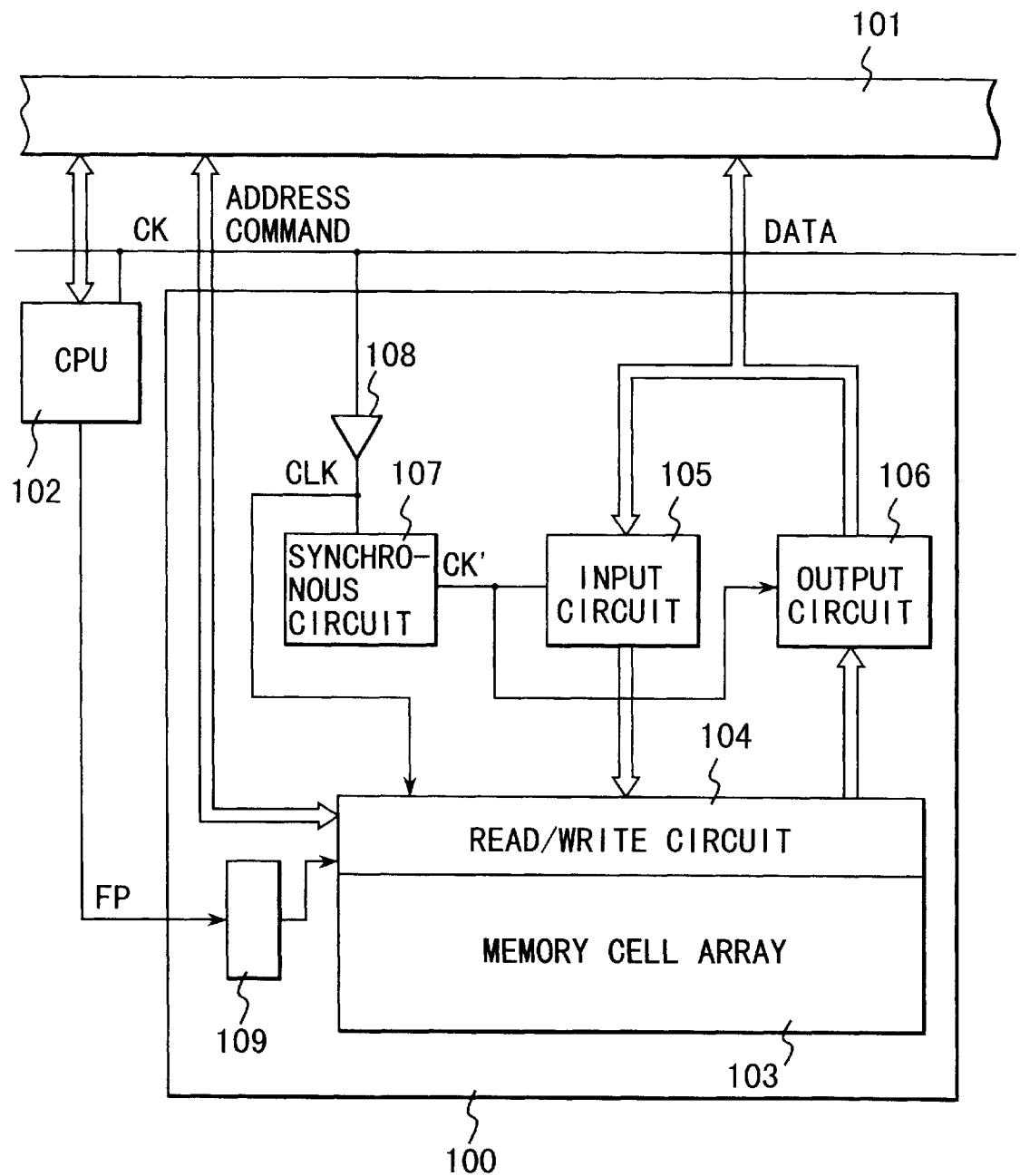
F I G. 19

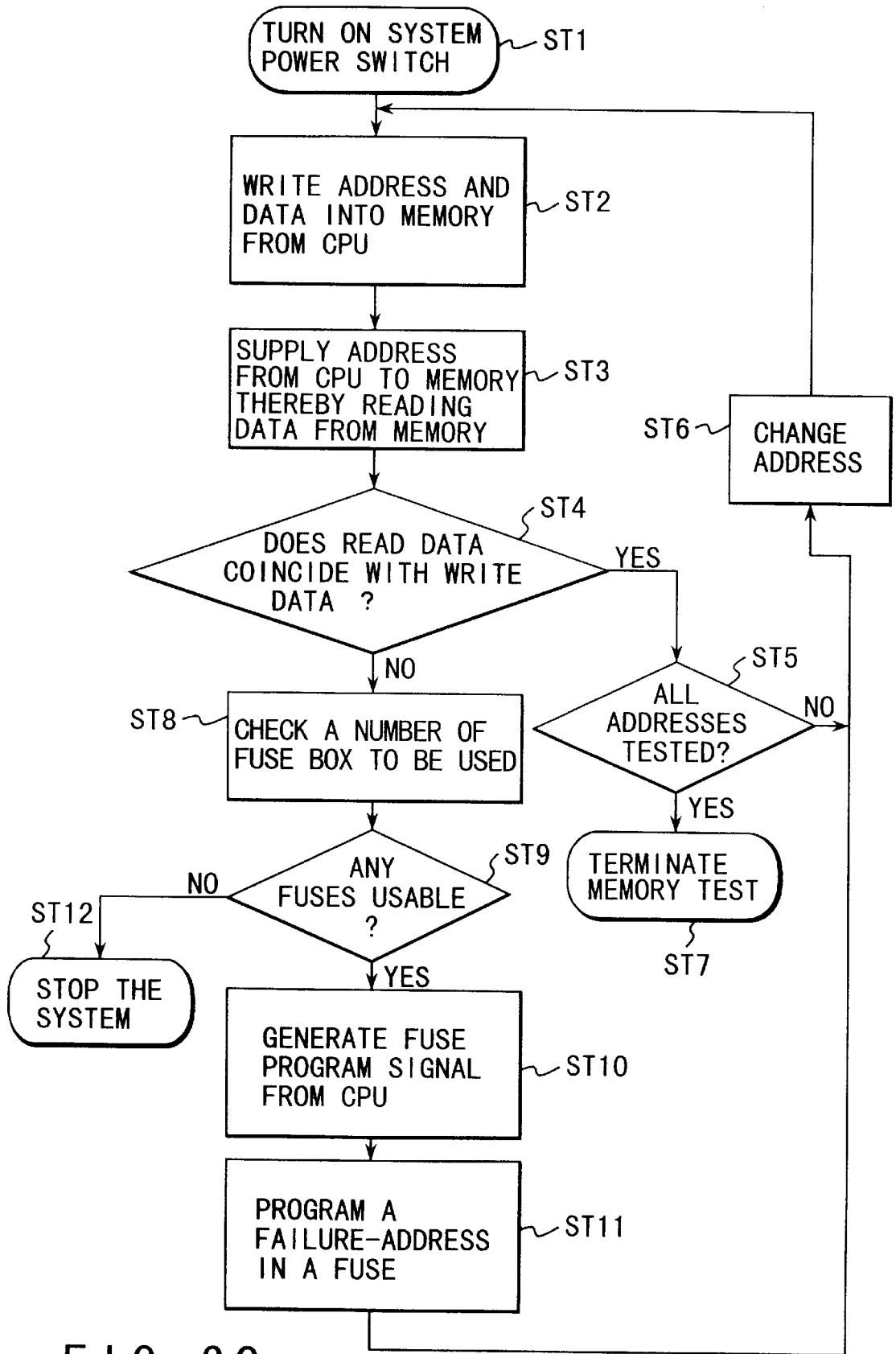
F I G. 20

SEMICONDUCTOR MEMORY DEVICE

BACKGROUND OF THE INVENTION

The present invention relates to a semiconductor memory device and a memory system using the same and, more particularly, to a redundancy system and method for remedying a failure.

More specifically, the present invention relates to an address identification system and method for identifying an address having undergone spare replacement in a multi-bit memory or the like for inputting/outputting data parallel.

For a large memory capacity, it is becoming important to simultaneously exchange a plurality of data with the memory upon reception of an address in order to effectively utilize the capacity. That is, the memory must have a multi-bit arrangement.

As the data amount which can be simultaneously exchanged increases, the data transfer efficiency increases to effectively utilize the capacity of the memory serving as a high-speed data transfer memory. At this time, the address spaces of bits simultaneously transferred are the same, and cannot be externally discriminated by addresses. In other words, the addresses of simultaneously input/output data are completely the same, and identified by only different I/Os outside the memory.

If the capacity of the memory becomes larger, the memory is manufactured by an advanced micropatterning technique. The non-defective ratio of memories as products, i.e., the yield greatly depends on the presence of dust and particles in the manufacturing process, the fluctuation of the manufacturing process, or the like.

Accordingly, the ratio of non-defectives in which all memory cells serving as data storage locations are perfect is naturally low. For this reason, the yield must be increased by a redundancy technique of arranging a redundancy memory cell in advance in addition to a memory cell having an originally necessary capacity, replacing a memory cell in which a failure occurs with the redundancy memory cell, and remedying the failure-memory cell.

FIG. 1 is a block diagram showing a conventional multi-bit memory. Memory cell arrays 11-1 to 11-n in which memory cells are laid out in an array have row decoders 12-1 to 12-n, sense amplifiers 13-1 to 13-n, and column switches 14-1 to 14-n, respectively.

When a row address signal is supplied to the row decoders 12-1 to 12-n, data of memory cells on selected rows in the memory cell arrays 11-1 to 11-n are sensed, amplified, and then latched by the sense amplifiers 13-1 to 13-n.

The sense amplifiers 13-1 to 13-n are commonly connected to DQ lines 15 via the column switches 14-1 to 14-n in units of columns.

A column address signal is supplied to the column switches 14-1 to 14-n and a DQ decoder 16. The column switches 14-1 to 14-n perform selection operations for the sense amplifiers 13-1 to 13-n to determine the connection relationship between the sense amplifiers and the DQ lines 15 in accordance with the column address signal.

The data latched by the selected sense amplifiers are read onto the DQ lines 15. The DQ decoder 16 performs a selection operation for the DQ lines 15. The data read onto the DQ lines 15 selected by the DQ decoder 16 are output via DQ buffers (DQB) 17-1 to 17-m.

Alternatively, write data input to the DQ buffers 17-1 to 17-m are selectively written in memory cells in the memory cell arrays 11-1 to 11-n via the DQ lines 15 selected by the DQ decoder 16, the corresponding column switches 14-1 to 14-n, and the corresponding sense amplifiers 13-1 to 13-n. The I/O to which a specific DQ line 15 belongs is fixed.

FIG. 2 schematically shows an example of how to take column redundancy in the multi-bit memory having this arrangement. FIG. 2 shows only an extracted portion related to decoding by the column address signal in FIG. 1.

Since a column address signal is supplied outside the memory to select a column, this column address signal is used to specify a failure-column and replace it with a spare column.

DQ lines common to the memory cell arrays 11-1 to 11-n are called over-laid DQ lines 15a. The respective pairs of over-laid DQ line 15a are selectively connected to sense amplifier circuits 13a each having four sense amplifiers via column switches 14a.

Eight pairs of over-laid DQ lines 15a have one pair of spare DQ lines 15b. The spare DQ lines 15b are connected to a spare sense amplifier circuit 13b having four spare amplifiers via a spare column switch 14b.

If a failure-column belongs to any one of the eight pairs of DQ lines 15a, the pair of DQ lines are entirely replaced with the pair of spare DQ lines 15b. The eight pairs of DQ lines 15a and one pair of spare DQ lines 15b belong to one I/O, and are selectively connected to each of the DQ buffers 17-1, 17-2, . . . via a corresponding one of DQ decoders 16-1, 16-2, . . . .

The DQ buffers 17-1, 17-2, . . . are respectively connected to RWD (read/write data) buses 18-1, 18-2, . . . to output/input I/O data outside the memory.

A fuse box 19 is constituted by a 4-bit circuit, i.e., a 1-bit fuse circuit 19a representing whether the spare DQ lines 15b are used, and 3-bit fuse circuits 19b, 19c, and 19d representing a failure-one of the eight pairs of over-laid DQ lines 15a.

The address of the failure-DQ line is designated in the fuse circuits 19b, 19c, and 19d. When the bits of a column address signal corresponding to the failure-DQ line coincide with the three bits, the DQ decoders 16-1, 16-2, . . . are switched to select the spare DQ lines 15b.

In general, each of the fuse circuits 19a to 19d constituting the fuse bits has a fuse element, which is fused and programmed by a current, a laser beam, or the like.

In the above arrangement, however, even when a spare must be used at only one I/O, the lines having the same address are also replaced with spares at all other I/Os.

No problem arises when the number of I/Os is small, and the number of DQ lines belonging to one I/O is large. However, as the number of bits increases, the number of spares increases, and spares are unnecessarily replaced simultaneously. For this reason, the above-described multi-bit memory redundancy system and method are wasteful.

In various systems using a semiconductor memory device with the above arrangement, when a failure occurs in a memory cell due to a deterioration over time or the like, the redundancy technique cannot be applied upon incorporating the memory device into the system.

As described above, the conventional semiconductor memory device is inefficient for failure remedy.

The redundancy system and method in the conventional multi-bit memory are wasteful and inefficient.

By the address identification system and method in the conventional multi-bit memory, an address in the multi-bit memory cannot be identified for each I/O, and spare replacement is inefficient.

In the conventional memory system and its redundancy method, when a failure occurs in a memory cell due to a deterioration over time or the like, the redundancy technique cannot be applied upon incorporating the memory cell into the system, and the failure of the memory cell becomes the failure of the whole system.

BRIEF SUMMARY OF THE INVENTION

The present invention has been made in consideration of the above situation, and has as its object to provide a semiconductor memory device in which a failure can be efficiently remedied.

It is another object of the present invention to provide a redundancy system and method capable of efficiently remedying a failure even for a larger number of bits.

It is still another object of the present invention to provide an address identification system and method capable of identifying an address in a multi-bit memory for each I/O, and efficiently performing spare replacement.

It is still another object of the present invention to provide a memory system and its redundancy system in which, even when a failure occurs in a memory cell due to a deterioration over time or the like, the memory cell can be remedied even upon incorporating the memory cell into the system.

To achieve these objects, according to the first aspect of the present invention, there is provided a semiconductor memory device comprising a plurality of memory cell arrays in which memory cells are laid out in a matrix form, row decoders arranged in correspondence with the plurality of memory cell arrays to select a row of each of the memory cell arrays on the basis of a row address signal, sense amplifier circuits arranged in correspondence with the plurality of memory cell arrays to receive data read out from memory cells on the row selected by the row decoders, DQ lines which are arranged in correspondence with the sense amplifier circuits, and commonly used in the plurality of memory cell arrays, column switches arranged in correspondence with the sense amplifier circuits to select sense amplifier circuits to be connected to the DQ lines on the basis of a column address signal, a plurality of DQ decoders for performing a selection operation for the DQ lines on the basis of the column address signal for each I/O, a plurality of DQ buffers arranged in correspondence with the DQ decoders to receive data on DQ lines selected by the DQ decoders for each I/O, a spare DQ line commonly used by the DQ lines belonging to respective I/Os, a spare sense amplifier circuit which receives data read out from a spare memory cell, a spare column switch for selecting connection of the spare sense amplifier circuit to the spare DQ line, first storage means for storing an address of a DQ line in which a failure has occurred, and second storage means, arranged for each I/O, for storing an I/O to which the failure-DQ line belongs, wherein, when the address stored in the first storage means is accessed, the DQ line belonging to the I/O stored in the second storage means and having the address stored in the first storage means, a sense amplifier circuit connected to the DQ line, and a column switch selecting the sense amplifier circuit are respectively replaced with the spare DQ line, the spare sense amplifier circuit, and the spare column switch, and the spare DQ line, the spare sense amplifier circuit, and the spare column switch are commonly used by the DQ lines belonging to respective I/Os.

According to the second aspect of the present invention, in the semiconductor memory device according to the first aspect, the first storage means comprises a fuse circuit for storing information on the number of bits corresponding to the number of DQ lines belonging to each I/O.

According to the third aspect of the present invention, in the semiconductor memory device according to the first aspect, the second storage means comprises a fuse circuit for storing 1-bit information.

According to the fourth aspect of the present invention, there is provided a semiconductor memory device comprising a plurality of memory cell arrays in which memory cells are laid out in a matrix form, row decoders arranged in correspondence with the plurality of memory cell arrays to select a row of each of the memory cell arrays on the basis of a row address signal, sense amplifier circuits arranged in correspondence with the plurality of memory cell arrays to receive data read out from memory cells on the row selected by the row decoders, DQ lines which are arranged in correspondence with the sense amplifier circuits, and commonly used in the plurality of memory cell arrays, column switches arranged in correspondence with the sense amplifier circuits to select sense amplifier circuits to be connected to the DQ lines on the basis of a column address signal, a plurality of DQ decoders for performing a selection operation for the DQ lines on the basis of the column address signal for each I/O, a plurality of DQ buffers arranged in correspondence with the DQ decoders to receive data on DQ lines selected by the DQ decoders for each I/O, a spare DQ line commonly used by the DQ lines belonging to respective I/Os, a spare sense amplifier circuit which receives data read out from a spare memory cell, a spare column switch for selecting connection of the spare sense amplifier circuit to the spare DQ line, first storage means for storing an address of a DQ line in which a failure has occurred, second storage means, arranged for each I/O, for storing an I/O to which the failure-DQ line belongs, and switching means for switching a data path extending to a DQ buffer corresponding to the failure-DQ line from the failure-DQ line belonging to the I/O stored in the second storage means and having the address stored in the first storage means, to a data path extending from the spare DQ line to the DQ buffer corresponding to the failure-DQ line when the address stored in the first storage means is accessed.

According to the fifth aspect of the present invention, in the semiconductor memory device according to the fourth aspect, the first storage means comprises a fuse circuit for storing information on the number of bits corresponding to the number of DQ lines belonging to each I/O.

According to the sixth aspect of the present invention, in the semiconductor memory device according to the fourth aspect, the second storage means comprises a fuse circuit for storing 1-bit information.

According to the seventh aspect of the present invention, there is provided a semiconductor memory device comprising a plurality of memory cell arrays in which memory cells are laid out in a matrix form, row decoders arranged in correspondence with the plurality of memory cell arrays to select a row of each of the memory cell arrays on the basis of a row address signal, sense amplifier circuits arranged in correspondence with the plurality of memory cell arrays to receive data read out from memory cells on the row selected by the row decoders, DQ lines which are arranged in correspondence with the sense amplifier circuits, and commonly used in the plurality of memory cell arrays, column switches arranged in correspondence with the sense amplifier circuits to select sense amplifier circuits to be connected to the DQ lines on the basis of a column address signal, a plurality of DQ decoders for performing a selection operation for the DQ lines on the basis of the column address signal for each I/O, a plurality of DQ buffers arranged in correspondence with the DQ decoders to receive data on DQ lines selected by the DQ decoders for each I/O, a spare DQ line commonly used by the DQ lines belonging to respective I/Os, a plurality of spare sense amplifier circuits which receive data read out from a spare memory cell, a spare column switch for selecting connection of the plurality of spare sense amplifier circuits to the spare DQ line, first detection means, arranged in correspondence with the plurality of spare sense amplifier circuits, for storing an address of a DQ line in which a failure has occurred, and detecting access to the stored address, second detection means for storing, for each I/O, information on whether a DQ line having the accessed address must be replaced, and when the first detection means detects the access to the address, detecting, for each I/O, the DQ line having the accessed address which must be replaced on the basis of the information, and switching means for switching a data path extending to a DQ buffer corresponding to the DQ line which must be replaced from the DQ line which must be replaced and detected by the second detection means, to a data path extending from the spare DQ line to the DQ buffer corresponding to the DQ line which must be replaced for each of the spare sense amplifier circuits when the second detection means detects that the DQ line must be replaced.

According to the eighth aspect of the present invention, in the semiconductor memory device according to the seventh aspect, the first detection means comprises a fuse circuit for storing information on the number of bits corresponding to the number of DQ lines belonging to each I/O.

According to the ninth aspect of the present invention, in the semiconductor memory device according to the seventh aspect, the second detection means comprises a fuse circuit for storing information on the number of bits corresponding to the plurality of spare sense amplifier circuits.

According to the 10th aspect of the present invention, there is provided a semiconductor memory device comprising a plurality of memory cell arrays in which memory cells are laid out in a matrix form, row decoders arranged in correspondence with the plurality of memory cell arrays to select a row of each of the memory cell arrays on the basis of a row address signal, sense amplifier circuits arranged in correspondence with the plurality of memory cell arrays to receive data read out from memory cells on the row selected by the row decoders, DQ lines which are arranged in correspondence with the sense amplifier circuits, and commonly used in the plurality of memory cell arrays, column switches arranged in correspondence with the sense amplifier circuits to select sense amplifier circuits to be connected to the DQ lines on the basis of a column address signal, a plurality of DQ decoders for performing a selection operation for the DQ lines on the basis of the column address signal for each I/O, a plurality of DQ buffers arranged in correspondence with the DQ decoders to receive data on DQ lines selected by the DQ decoders for each I/O, a spare DQ line commonly used by the DQ lines belonging to respective I/Os, a plurality of spare sense amplifier circuits which receive data read out from a spare memory cell, a spare column switch for selecting connection of the plurality of spare sense amplifier circuits to the spare DQ line, first detection means, arranged in correspondence with the plurality of spare sense amplifier circuits, for storing an address of a DQ line in which a failure has occurred, and detecting access to the stored address, second detection means for storing, for each I/O, information on whether a DQ line having the accessed address must be replaced, and when the first detection means detects the access to the address, detecting, for each I/O, the DQ line having the accessed address which must be replaced on the basis of the information, third detection means for detecting access to a memory cell array to be replaced, and switching means for switching a data path extending to a DQ buffer corresponding to the DQ line detected by the second detection means from the DQ line of the memory cell array to be replaced that is detected by the second detection means, to a data path extending from the spare DQ line to the DQ buffer corresponding to the DQ line which must be replaced for each of the spare sense amplifier circuits when the second detection means detects the DQ line, and the third detection means detects the access.

According to the 11th aspect of the present invention, in the semiconductor memory device according to the 10th aspect, the first detection means comprises a fuse circuit for storing information on the number of bits corresponding to the number of DQ lines belonging to each I/O.

According to the 12th aspect of the present invention, in the semiconductor memory device according to the 10th aspect, the second detection means comprises a fuse circuit for storing information on the number of bits corresponding to the plurality of spare sense amplifier circuits.

According to the 13th aspect of the present invention, in the semiconductor memory device according to the 10th aspect, the third detection means comprises a fuse circuit storing information on the number of bits corresponding to the number of memory cell arrays independently activated.

According to the 14th aspect of the present invention, there is provided a redundancy system comprising a memory in which address spaces of bits to be simultaneously transferred are the same, an address fuse box in which an address subjected to redundancy is programmed, determination means for determining whether the address programmed in the address fuse box coincides with an accessed address with respect to the memory, a fuse circuit for storing an I/O at which the address programmed in the address fuse box is used, and switching means for switching a data path having the address programmed in the fuse circuit at the I/O stored in the fuse circuit to another data path when the determination means determines that the programmed address coincides with the accessed address.

According to the 15th aspect of the present invention, there is provided an address identification system comprising a data access system having a plurality of parallel data layers for a single address, a group of fuse boxes for storing a failure-address, a coordinate system for designating the fuse boxes, and a group of identification fuse bits which are arranged for respective input/output paths of data output parallel to the single address of the data access system, and in which a coordinate of a fuse box used for each input/output path corresponding to a data layer of the data access system is programmed, wherein a data layer having the address stored in the fuse box is identified for an input address.

According to the 16th aspect of the present invention, there is provided an address identification method in an address identification system, the address identification system comprising a data access system having a plurality of parallel data layers for a single address, a group of fuse boxes for storing a failure-address, a coordinate system for designating the fuse boxes, and a group of identification fuse bits which are arranged for respective input/output paths of data output parallel to the single address of the data access system, and in which a coordinate of a fuse box used for each input/output path corresponding to a data layer of the data access system is programmed, the address identification method in the address identification system, comprising the steps of programming the coordinate of the fuse box used for each input/output path corresponding to the data layer of the data access system in an identification fuse bit, and identifying a data layer having the address stored in the fuse box for an input address.

According to the 17th aspect of the present invention, in the address identification method of the address identification system according to the 16th aspect, the fuse box has a plurality of fuse bits corresponding to bits of an address, and the fuse bits are programmed to selectively respond to an address.

According to the 18th aspect of the present invention, in the address identification method of the address identification system according to the 16th aspect, the coordinate system for designating the fuse boxes comprises a plurality of bit groups constituted by a plurality of bits, one fuse box is designated by designating one bit in each of the bit groups, and all fuse boxes are designated by a combination of bits each from each bit group.

According to the 19th aspect of the present invention, in the address identification method of the address identification system according to the 16th aspect, the group of identification fuse bits expressing the coordinate system that are arranged for the respective input/output paths of data output parallel has fuse bits corresponding to bits of a plurality of bit groups constituted by a plurality of bits.

According to the 20th aspect of the present invention, in the address identification method of the address identification system according to the 16th aspect, a bit corresponding to the coordinates of the fuse box used for each input/output path corresponding to the data layer is programmed on the identification fuse bits, and a data layer which responds to the fuse box for an address is identified.

According to the 21st aspect of the present invention, there is provided a memory system comprising a memory chip, a CPU for controlling read/write of data from/in the memory chip, and a bus for exchanging data between the memory chip and the CPU, wherein the memory chip comprises a memory cell array, a spare memory cell fuse means for, when a failure occurs in a memory cell of the memory cell array, replacing the failure-memory cell with the spare memory cell, read/write means for reading/writing data from/in the memory cell array in response to an address and a command supplied from the CPU, input means for supplying data from the CPU via the bus to the read/write means, output means for supplying data read out from the memory cell array by the read/write means to the CPU via the bus, internal clock generation means for generating an internal clock from an external clock supplied from the CPU, and controlling the read/write means, the input means, and the output means on the basis of the internal clock, and fuse program means for programming a failure-address in the fuse means on the basis of a fuse program signal supplied from the CPU, whereby, after the CPU writes data in a memory cell of the memory cell array, the data is read out and subjected to verification, in the case of incoincidence, the CPU supplies the fuse program signal to the fuse program means, the fuse program means programs the failure-address in the fuse means, and a memory cell in which a failure has occurred is replaced with the spare memory cell on the basis of the address programmed in the fuse means.

According to the 22nd aspect, in the memory system according to the 21st aspect, the internal clock generation means comprises a clock buffer for generating the internal clock on the basis of the external clock supplied from the CPU, and supplying the internal clock to the read/write circuit, and a synchronous circuit for eliminating a skew of the internal clock output from the clock buffer with respect to the external clock, and outputting the internal clock from which the skew is eliminated to the input means and the output means.

According to the 23rd aspect of the present invention, there is provided a redundancy method in a memory system, wherein the memory system comprises a memory chip, a CPU for controlling read/write of data from/in the memory chip, and a bus for exchanging data between the memory chip and the CPU, wherein the memory chip comprises a memory cell array, a spare memory cell fuse means for, when a failure occurs in a memory cell of the memory cell array, replacing the failure-memory cell with the spare memory cell, read/write means for reading/writing data from/in the memory cell array in response to an address and a command supplied from the CPU, input means for supplying data from the CPU via the bus to the read/write means, output means for supplying data read out from the memory cell array by the read/write means to the CPU via the bus, internal clock generation means for generating an internal clock from an external clock supplied from the CPU, and controlling the read/write means, the input means, and the output means on the basis of the internal clock, and fuse program means for programming a failure-address in the fuse means on the basis of a fuse program signal supplied from the CPU, the redundancy method in the memory system, comprising the first step of writing data from the CPU via the bus in the memory chip, the second step of reading out the written data from the memory chip to the CPU via the bus, the third step of causing the CPU to verify the data written in the memory chip in the first step with the data read out from the memory chip in the second step, and the fourth step of, when incoincidence between the two data is detected in the third step, supplying the fuse program signal from the CPU to the fuse program means, and programming a failure-address in the fuse means.

According to the 24th aspect of the present invention, in the redundancy method of the memory system according to the 23rd aspect, the first to fourth steps are repeatedly executed for each memory cell in the memory cell array.

According to the 25th aspect of the present invention, the redundancy method of the memory system according to the 23rd aspect further comprises between the third and fourth steps the fifth step of checking the number of usable fuse means, wherein, in the fifth step, if that usable fuse means is left is detected, the fourth step is executed to program the failure-address in the fuse means, and if that no usable fuse means is left is detected, a system failure is determined to stop redundancy.

According to the 26th aspect of the present invention, the redundancy method of the memory system according to the 23rd aspect further comprises between the third and fourth steps the fifth step of checking the number of usable fuse means, wherein, in the fifth step, if that usable fuse means is left is detected, the fourth step is executed to program the failure-address in the fuse means, and if that no usable fuse means is left is detected, a system failure is determined to stop redundancy.

The functions of these aspects will be described below.

According to the first to sixth aspects, since only a memory cell belonging to one I/O where a failure has occurred is replaced, the memory cell can be efficiently remedied for a larger number of bits. The spare DQ line is common to the respective I/Os, and need not be arranged for each I/O. Only a 1-bit fuse circuit representing whether the spare DQ line is used is arranged, contributing to high integration of the semiconductor memory device.

According to the seventh to ninth aspects, since spare replacement for sense amplifiers in sense amplifier circuits belonging to different I/Os can be independently performed by each spare sense amplifier in the spare sense amplifier circuit, more efficient remedy can be performed even for a larger number of bits. The spare DQ line is common to the respective I/Os, and need not be arranged for each I/O, contributing to high integration of the semiconductor memory device.

According to the 10th to 13th aspects, spare replacement for sense amplifiers in sense amplifier circuits belonging to different I/Os can be independently performed by each spare sense amplifier in the spare sense amplifier circuit in units of memory cell arrays independently activated. Therefore, more efficient remedy can be performed even for a larger number of bits.

The spare DQ line is common to the respective I/Os, and need not be arranged for each I/O, contributing to high integration of the semiconductor memory device. In addition, since the data transfer path extending from the spare DQ buffer is used as the data transfer path extending from the DQ buffer, the capacity of the spare DQ line can be set substantially equal to that of another DQ line to make the data transfer speed constant.

According to the 14th aspect, the fuse circuit can have information on I/Os which cannot be identified by only an address supplied to the system in a memory wherein the address spaces of bits simultaneously transferred are the same. Accordingly, the redundancy system capable of efficiently remedying a failure even for a larger number of bits can be provided.

According to the 15th aspect, by arranging the identification fuse bits in which the coordinates of a fuse box used for each I/O corresponding to the data layer of the system are programmed in a multi-bit memory or the like, the address identification system capable of identifying the same addresses of I/Os, and efficiently performing spare replacement can be provided.

According to the 16th aspect, in a multi-bit memory or the like, the coordinates of the fuse box used for each I/O corresponding to the data layer of the system are programmed in the identification fuse bits, and the data layer of the address stored in the fuse box is identified for an input address. Therefore, the address identification method capable of efficiently performing spare replacement can be provided.

According to the 17th aspect, the fuse box is constituted by a plurality of fuse bits corresponding to the bits of an address, and the fuse bits are programmed to selectively respond to the address.

According to the 18th aspect, the coordinate system for designating the fuse box consists of a plurality of bit groups constituted by a plurality of bits. One fuse box can be designated by designating one bit in each bit group, and all fuse boxes can be designated by a combination of bits each from each bit group.

According to the 19th aspect, the group of identification fuse bits for expressing the coordinate system that are respectively arranged for the input/output paths of data output parallel can be constituted by fuse bits corresponding to the bits of a plurality of bit groups formed of a plurality of bits.

According to the 20th aspect, when bits corresponding to the coordinate of the fuse box used for each input/output path corresponding to the data layer are programmed on the identification fuse bits, a data layer which responds to the fuse box for an address can be identified.

According to the 21st and 22nd aspects, when a failure occurs in a memory cell due to a deterioration over time or the like upon incorporating the memory cell into the memory system, after test data from the CPU is written, the data is read out and verified. The spare memory cell can replace and remedy the failure-memory cell.

According to the 23rd aspect, when a failure occurs in a memory cell due to a deterioration over time or the like upon incorporating the memory cell into the memory system, after test data from the CPU is written, the data is read out and verified. The spare memory cell can replace and remedy the failure-memory cell.

According to the 24th aspect, in the redundancy method of the 23rd aspect, if the first to fourth steps are repeatedly executed for each memory cell in the memory cell array, all the memory cells in the memory cell array can be verified.

According to the 25th and 26th aspects, in the redundancy method of the 23rd aspect, when verification is performed while checking the number of usable fuse means, an unnecessary test with respect to a memory chip which cannot be remedied can be avoided.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram showing only an extracted portion related to decoding by a column address signal in a multi-bit memory in order to explain a semiconductor memory device according to the first embodiment of the present invention;

FIG. 4 is a circuit diagram showing a fuse box in the circuit shown in FIG. 3;

FIG. 13 is a circuit diagram showing a fuse box representing an I/O at which a specific sense amplifier in a spare sense amplifier is used, a fuse box representing an I/O at which the spare is used when a memory cell array is selected, and a circuit portion related to them in the circuit shown in FIG. 11;

FIG. 14 is a circuit diagram showing a data path switching circuit in FIG. 11;

FIG. 15 is a view showing the address space representing the group of memory cells or data to be entirely replaced with a spare at once in an actual memory in order to explain a redundancy system and method and an address identification system and method according to the fourth embodiment of the present invention;

FIG. 16 is a view for explaining the function of an address fuse box;

FIG. 17 is a view showing the fuse box space constituted by 352 fuse boxes;

FIG. 19 is a block diagram showing a memory system according to the fifth embodiment of the present invention; and FIG. 20 is a flow chart for explaining the redundancy method in the memory system shown in FIG. 19.

DETAILED DESCRIPTION OF THE INVENTION

An embodiment of the present invention will be described below with reference to the several views of the accompanying drawing.

Figure 1:
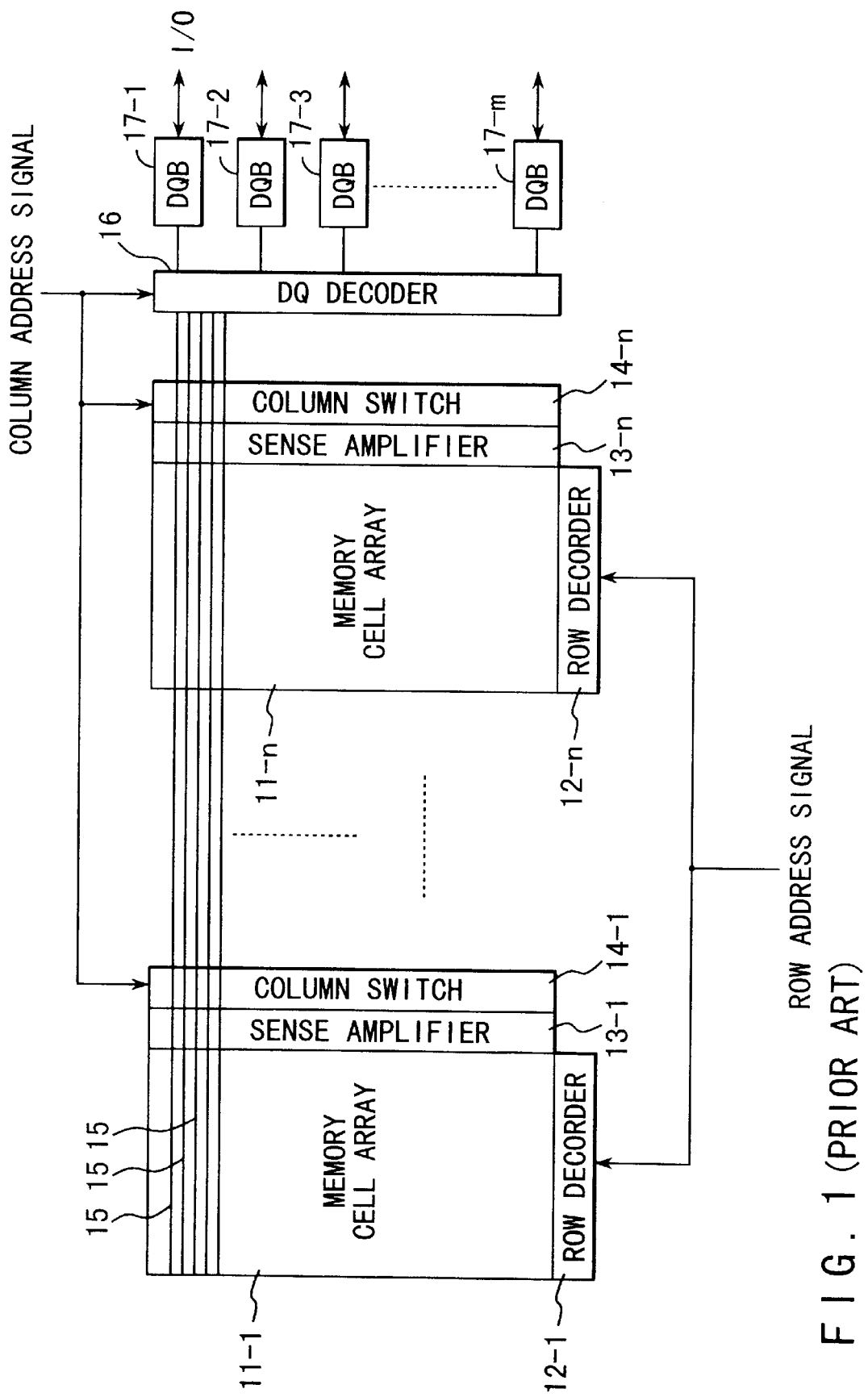
FIG. 1 is a block diagram showing a conventional multi-bit memory.

FIG. 3 is a circuit diagram for explaining the redundancy system and method of a semiconductor memory device according to the first embodiment of the present invention, and schematically shows only an extracted portion related to decoding by a column address signal in the multi-bit memory shown in FIG. 1.

Figure 2:
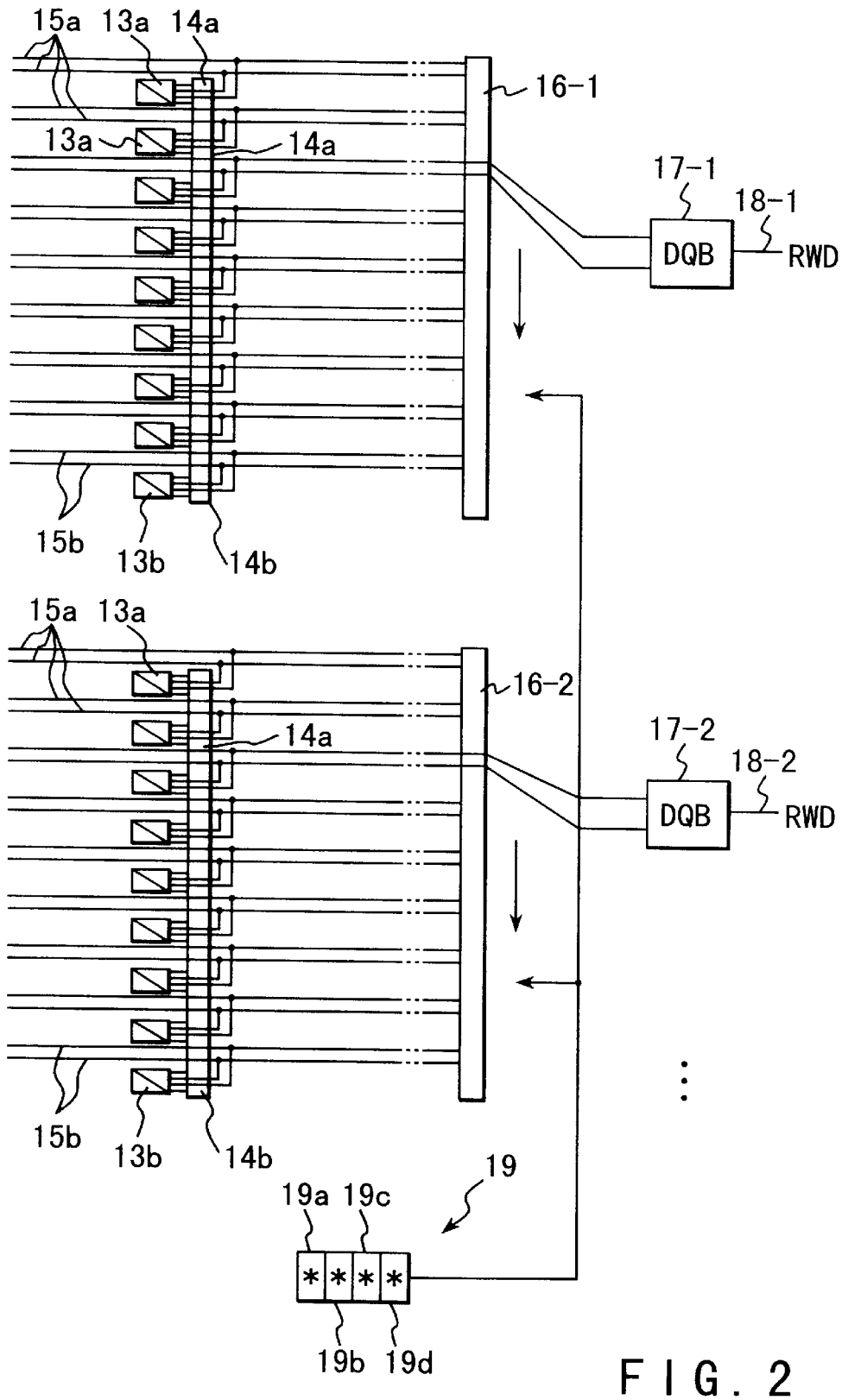
FIG. 2 is a circuit diagram schematically showing an example of how to take column redundancy in the conventional multi-bit memory.

More specifically, the circuit shown in FIG. 3 is different from the conventional circuit shown in FIG. 2 in that spare DQ lines 15c to be replaced are arranged for a plurality of I/Os instead of arranging the spare DQ lines 15b for each I/O.

The spare DQ lines 15c are connected to a spare sense amplifier circuit 13c and a spare memory cell (not shown) via a spare column switch 14c. Eight pairs of DQ lines 15a except for the spare DQ lines 15b in FIG. 2 belong to each I/O.

The spare DQ lines 15c are common to respective I/Os, and are commonly connected to all DQ decoders 16-1, 16-2, . . . . For both the spare DQ line 15c and the regular DQ line 15a, a sense amplifier circuit to be connected to the DQ line is selected by a column switch 14a or 14c selected by a column address signal.

A fuse box 20 belongs to one I/O, and is constituted by 3-bit fuse circuits 20a, 20b, and 20c for identifying which of the eight pairs of DQ lines 15a selected by a column address signal are failure-DQ lines.

A 1-bit fuse circuit 21-1, 21-2, . . . arranged for each I/O is used to designate whether the spare DQ lines 15c are used.

FIG. 4 shows an example of the arrangement of the fuse box 20 in the circuit shown in FIG. 3. Each of the fuse circuits 20a to 20c comprises fuse elements F1 and F2, P-channel MOS transistors Q1 to Q4, N-channel MOS transistors Q5 and Q6, inverter circuits INV1 to INV4, AND gates 23 and 24, an OR gate 25, and the like.

Although FIG. 4 shows only the circuit arrangement of the fuse circuit 20a in detail, and shows the fuse circuits 20b and 20c as blocks, the fuse circuits 20b and 20c also have substantially the same arrangement as that of the fuse circuit 20a.

A signal BPRST is supplied to the gates of the MOS transistors Q1 and Q5 and the gates of the MOS transistors Q3 and Q6. The source and drain of the MOS transistor Q1, the fuse element F1, and the drain and source of the MOS transistor Q5 are series-connected between power sources Vcc and Vss.

A connection node N1 between the drain of the MOS transistor Q1 and the fuse element F1 is connected to the drain of the MOS transistor Q2 and the input terminal of the inverter circuit INV1.

The source of the MOS transistor Q2 is connected to the power source Vcc, and its gate is connected to the output terminal of the inverter circuit INV1. The MOS transistor Q2 and the inverter circuit INV1 constitute a latch circuit to latch the potential of the node N1.

The input terminal of the inverter circuit INV2 is connected to the output terminal of the inverter circuit INV1, and the output terminal of the inverter circuit INV2 is connected to one input terminal of the AND gate 23.

The other input terminal of the AND gate 23 receives one bit A0 of a column address, and an output from the AND gate 23 is supplied to one input terminal of the OR gate 25.

The source and drain of the MOS transistor Q3, the fuse element F2, and the drain and source of the MOS transistor Q6 are series-connected between the power sources Vcc and Vss.

A connection node N2 between the drain of the MOS transistor Q3 and the fuse element F2 is connected to the drain of the MOS transistor Q4 and the input terminal of the inverter circuit INV3.

The source of the MOS transistor Q4 is connected to the power source Vcc, and its gate is connected to the output terminal of the inverter circuit INV3. The MOS transistor Q4 and the inverter circuit INV3 constitute a latch circuit to latch the potential of the node N2.

The input terminal of the inverter circuit INV4 is connected to the output terminal of the inverter circuit INV3, and the output terminal of the invertor circuit INV4 is connected to one input terminal of the AND gate 24. The other input terminal of the AND gate 24 receives a complementary signal /A0 (/ represents an inverted signal, i.e., a bar) of one bit A0 of the column address, and an output from the AND gate 24 is supplied to the other input terminal of the OR gate 25.

The fuse circuit 20b receives one bit A1 of the column address and its complementary signal /A1, whereas the fuse circuit 20c receives one bit A2 of the column address and its complementary signal /A2.

The signal BPRST is a signal which changes to "L" level at the start of access to turn on the MOS transistors Q1 and Q3, turn off the MOS transistors Q5 and Q6, and precharge the nodes N1 and N2, and then changes to "H" level to hold the state wherein the fuse element F1 or F2 is cut off.

In performing redundancy, either one of the fuses F1 and F2 is cut off, and both the fuses need not be cut off. At an address bit where the fuse element F1 or F2 is cut off, an output signal Bj (j=0 to 2) from the OR gate 25 in the fuse circuit changes to "H" level.

Output signals B0, B1, and B2 from the OR gates 25 in the fuse circuits 20a to 20c are supplied to an AND gate 26. When the address of a failure-DQ line completely coincides with the bits of cut fuse elements, in other words, the input address of the failure-DQ line coincides with an address stored in the fuse box 20, an output signal RDQ from the AND gate 26 changes to "H" level.

Figure 5:
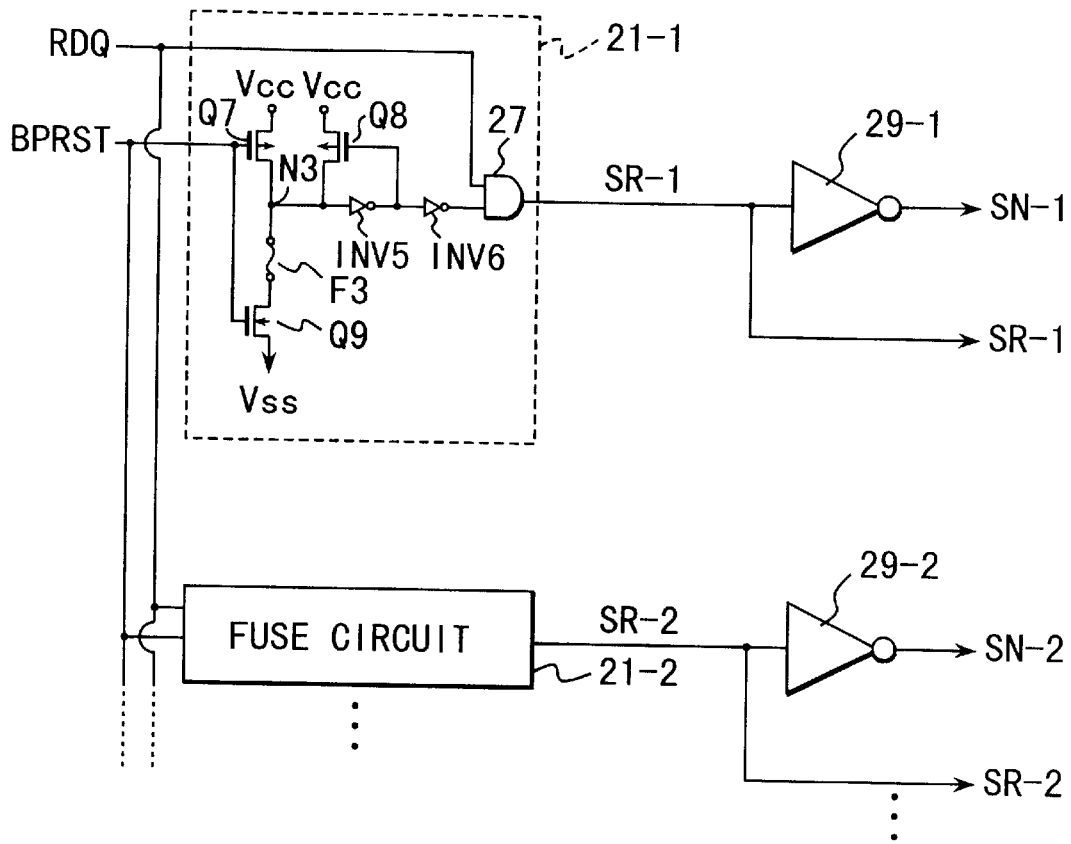
FIG. 5 is a circuit diagram showing a fuse circuit in the circuit shown in FIG. 3.

FIG. 5 shows an example of the fuse circuits 21-1, 21-2, . . . in the circuit shown in FIG. 3. Each fuse circuit has substantially the same arrangement as that of one complementary circuit in the fuse circuit shown in FIG. 4.

Each of the fuse circuits 21-1, 21-2, . . . comprises a fuse element F3, P-channel MOS transistors Q7 and Q8, an N-channel MOS transistor Q9, inverter circuits INV5 and INV6, an AND gate 27, and the like.

The signal BPRST is supplied to the gates of the MOS transistors Q7 and Q9. The source and drain of the MOS transistor Q7, the fuse element F3, and the drain and source of the MOS transistor Q9 are series-connected between the power sources Vcc and Vss.

A connection node N3 between the drain of the MOS transistor Q7 and the fuse element F3 is connected to the drain of the MOS transistor Q8 and the input terminal of the inverter circuit INV5.

The source of the MOS transistor Q8 is connected to the power source Vcc, and its gate is connected to the output terminal of the inverter circuit INV5. The MOS transistor Q8 and the inverter circuit INV5 constitute a latch circuit to latch the potential of the node N3.

The input terminal of the inverter circuit INV6 is connected to the output terminal of the inverter circuit INV5, and the output terminal of the inverter circuit INV6 is connected to one input terminal of the AND gate 27. The other input terminal of the AND gate 27 receives the signal RDQ output from the AND gate 26.

Although the fuse circuit 21-1 has representatively been described, the remaining fuse circuits 21-2, . . . arranged in correspondence with respective I/Os also have the same arrangement as that of the fuse circuit 21-1.

The data path is switched by output signals SR-1, SR-2, . . . from the fuse circuits 21-1, 21-2, . . . and signals SN-1, SN-2, . . . prepared by inverting the output signals SR-1, SR-2, . . . by inverter circuits 29-1, 29-2, . . . .

If the fuse element F3 in a fuse circuit belonging to an I/O where a failure has occurred is cut off, an output from the inverter circuit INV6 changes to "H" level. When an input address corresponding to the failure-DQ line coincides with an address stored in the fuse box 20 to change the signal RDQ to "H" level, an output signal from the AND gate 27 of a fuse circuit arranged in correspondence with the I/O belonging to the failure-DQ line changes to "H" level. The output signal SR changes to "H" level; and the output signal SN from the inverter circuit 29, to "L" level.

In a fuse circuit corresponding to an I/O free from any failure, the output signal SR from an OR gate 28 is at "L" level, and the output signal SN from the inverter circuit 29 at "H" level.

Figure 6:
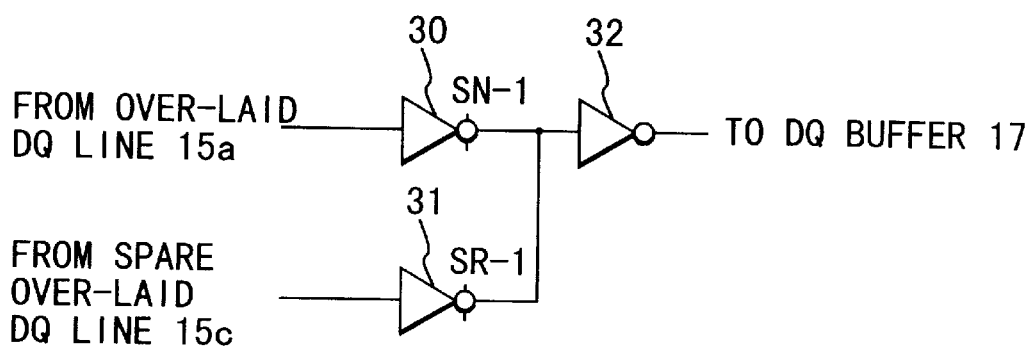
FIG. 6 is a circuit diagram showing a data path switching circuit for switching the data path extending from a failure-DQ line to a DQ buffer, to the data path extending from a spare memory cell to the DQ buffer upon performing redundancy in the circuit shown in FIG. 3.

FIG. 6 shows a simplified data path switching circuit which switches the data path extending to a DQ buffer from a memory cell belonging to an I/O corresponding to a failure-DQ line, to the data path extending from a spare memory cell to the DQ buffer upon performing redundancy, and is arranged for each over-laid DQ line 15a. This switching circuit is arranged for each of DQ decoders 16-1, 16-2, . . . .

This switching circuit comprises clocked inverter circuits 30 and 31 and an inverter circuit 32. The input terminal of the clocked inverter circuit 30 is connected to the over-laid DQ line 15a, and its clock input terminal receives the output signal SN from the circuit shown in FIG. 5.

The input terminal of the clocked inverter circuit 31 is connected to the spare over-laid DQ line 15c, and its clock input terminal receives the signal SR. The output terminals of the clocked inverter circuits 30 and 31 are connected to the input terminal of the inverter circuit 32, and the output terminal of the inverter circuit 32 is connected to the input terminal of the DQ buffer 17.

The clocked inverter circuit 30 operates as an inverter circuit when the signal SN is at "H" level, and its output terminal is in a high-impedance state when the signal SN is at "L" level. Similarly, the clocked inverter circuit 31 operates as an inverter circuit when the signal SR is at "H" level, and its output terminal is in a high-impedance state when the signal SR is at "L" level.

When an input address does not coincide with the respective bits of the fuse box 20, the over-laid DQ line 15a is selected, and a signal on the over-laid DQ line 15a is supplied to the DQ buffer 17 via the clocked inverter circuit 30 and the inverter circuit 32.

When the input address coincides with the respective bits of the fuse box 20 (the over-laid DQ line 15a failed), the spare over-laid DQ line 15c is selected, and a signal on the spare over-laid DQ line 15c is supplied to the DQ buffer 17 via the clocked inverter circuit 31 and the inverter circuit 32.

According to the redundancy system and method of the semiconductor memory device, since only a memory cell belonging to one I/O where a failure has occurred is replaced, the memory cell can be efficiently remedied even for a larger number of bits.

The spare memory cell, the spare sense amplifier circuit 13c, the spare column switch 14c, and the spare DQ lines 15c are common to the respective I/Os, and need not be arranged for each I/O. Only the 1-bit fuse circuits 21-1, 21-2, . . . which store whether a failure-DQ line exists are arranged for the respective I/Os, contributing to high integration.

Figure 7:
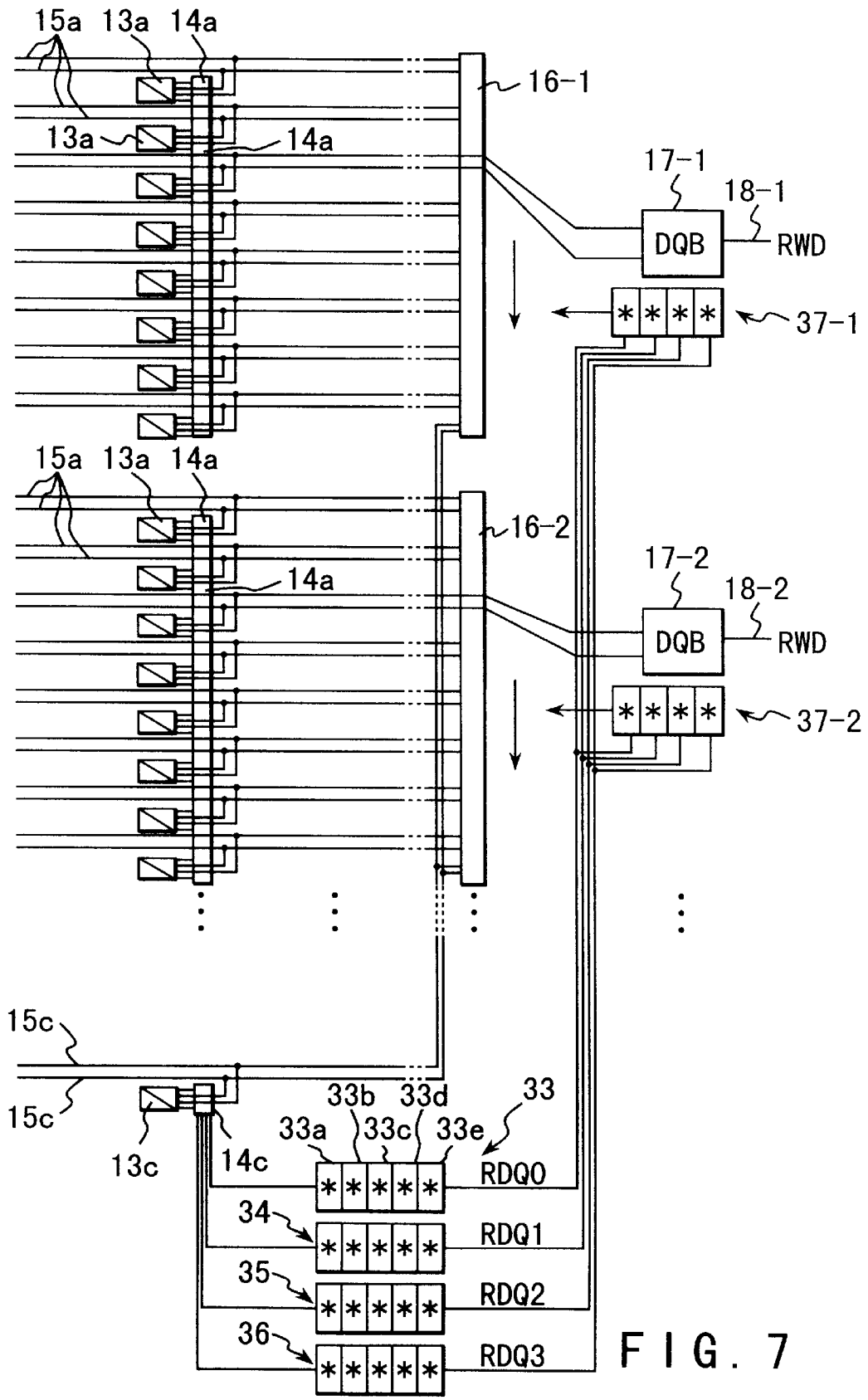
FIG. 7 is a circuit diagram schematically showing only an extracted portion related to decoding by a column address signal in a multi-bit memory in order to explain a semiconductor memory device according to the second embodiment of the present invention.

FIG. 7 is a circuit diagram for explaining the redundancy system and method of a semiconductor memory device according to the second embodiment of the present invention, in which the system and method shown in FIG. 3 can be independently used for four sense amplifiers belonging to a spare DQ line.

More specifically, in the first embodiment, spare replacement is performed at only an I/O requiring a spare. When a certain I/O uses the spare DQ lines 15c, another I/O cannot use any spare DQ line.

Spare replacement is performed for all the four sense amplifiers in the spare sense amplifier circuit 13c, and the set of four sense amplifiers is fixed. Therefore, the second embodiment will provide a more efficient redundancy system and method.

In the circuit shown in FIG. 7, the same reference numerals as in FIG. 3 denote the same parts. The number of sense amplifiers in sense amplifier circuits 13a belonging to each I/O is 4×8 (pairs)=32. Selection of a sense amplifier requires a 5-bit fuse circuit.

Since each of four spare sense amplifiers in a spare sense amplifier circuit 13c arranged at spare DQ lines 15c can independently accept replacement, four fuse boxes 33 to 36 each formed of 5 bits are arranged.

The spare DQ lines 15c are common to DQ decoders 16-1, 16-2, . . . , and the spare DQ lines 15c can replace one sense amplifier in the four sense amplifier circuits 13a belonging to four different DQ lines 15a.

To represent I/Os at which the four spare sense amplifiers are respectively used, fuse boxes 37-1, 37-2, . . . each having a 4-bit fuse circuit are arranged for respective I/Os.

Only one I/O can use each of the 4-bit fuse boxes 37-1, 37-2, . . . . When a column address signal instructs a failure-column, the DQ lines 15c are selected by the DQ decoder 16-1, 16-2, . . . at only an I/O representing the use of the fuse box.

Figure 8:
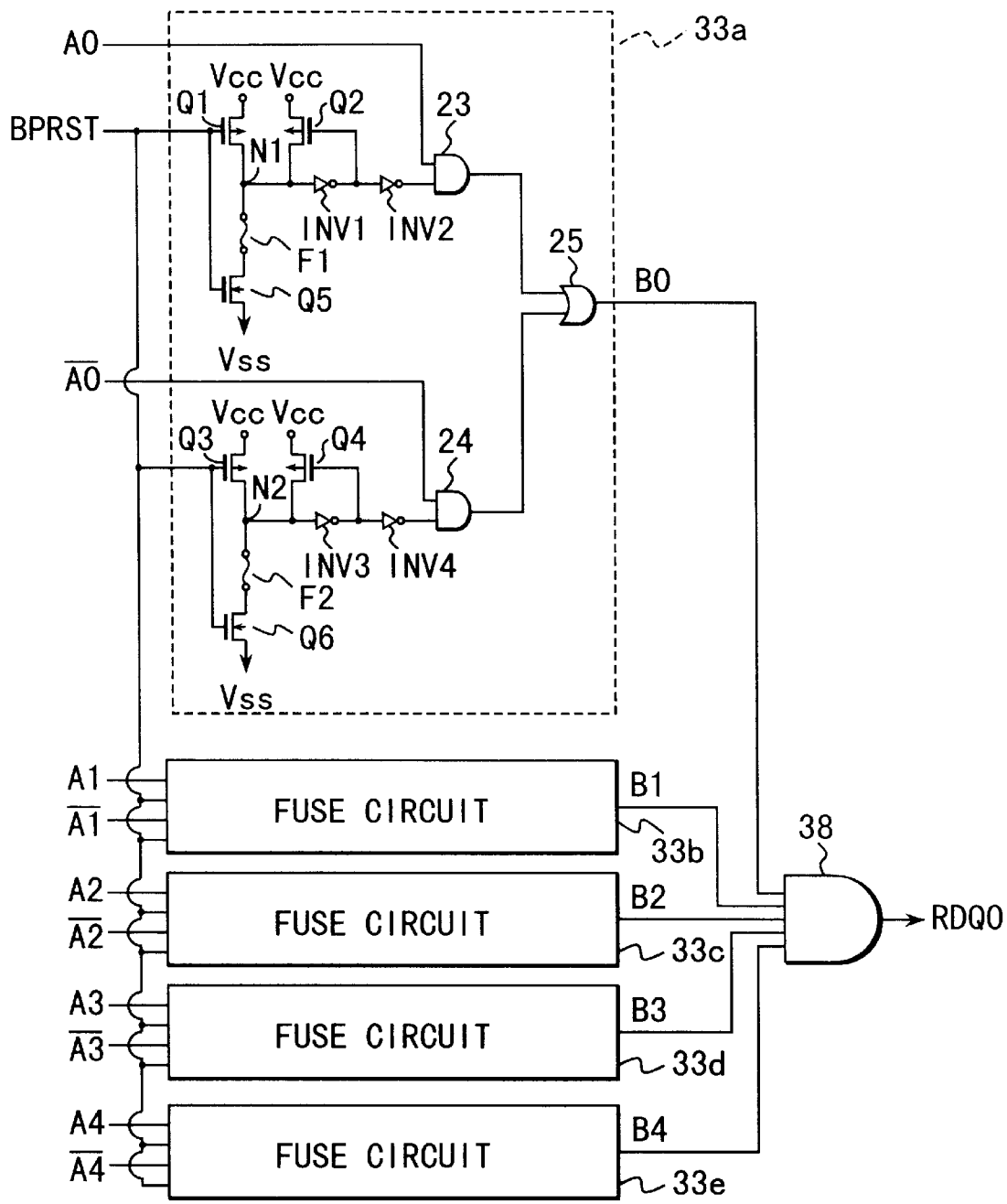
FIG. 8 is a circuit diagram showing an example of the arrangement of a fuse box for selecting a sense amplifier in a sense amplifier circuit belonging to each I/O in the circuit shown in FIG. 7.
Figure 9:
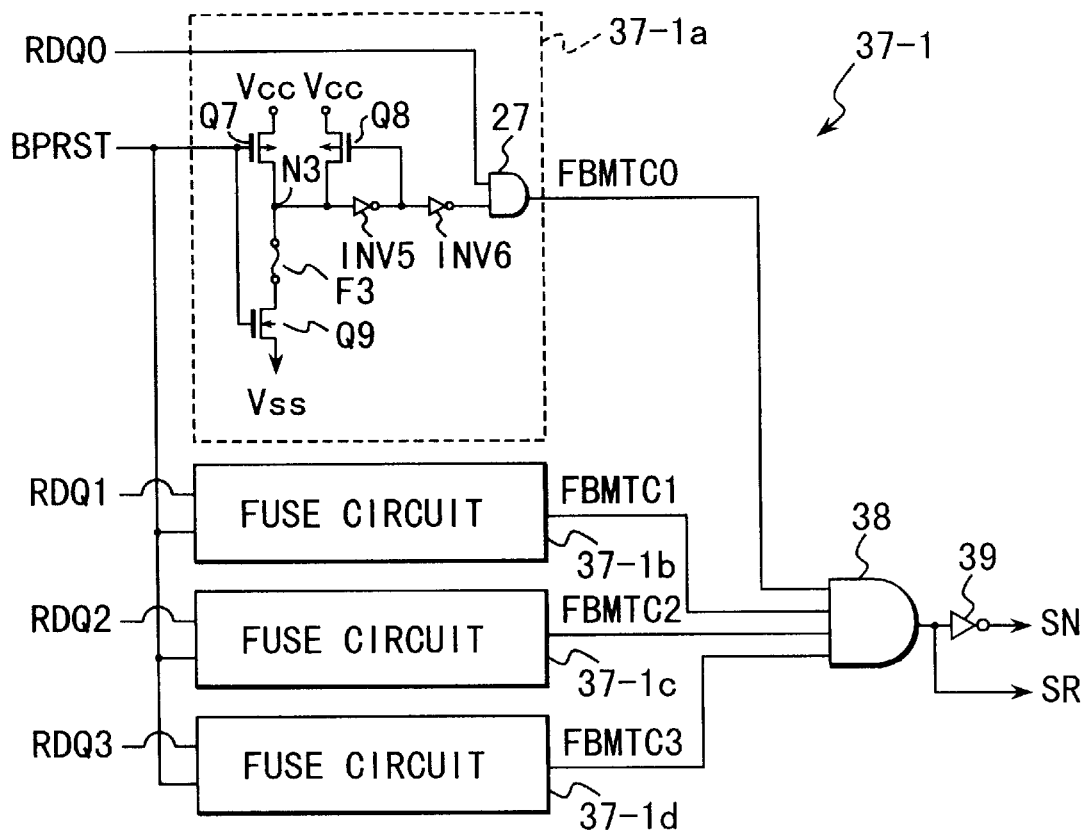
FIG. 9 is a circuit diagram showing an example of the arrangement of a fuse box representing an I/O at which a specific sense amplifier in a spare sense amplifier circuit in the circuit shown in FIG. 7 is used.
Figure 10:
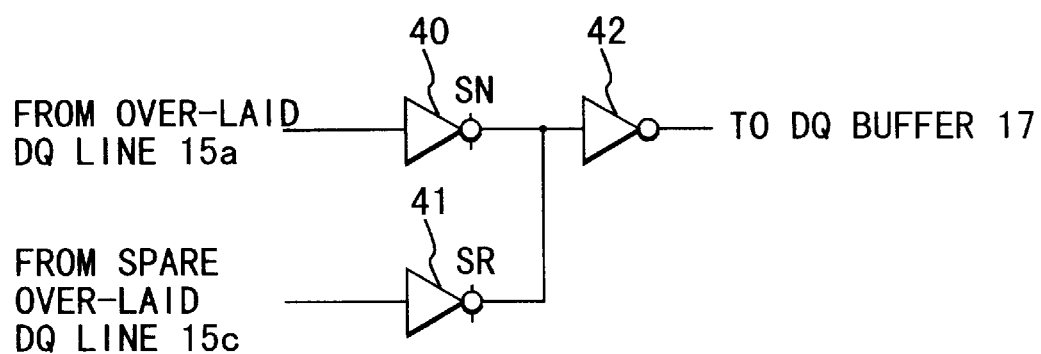
FIG. 10 is a circuit diagram showing a simplified data path switching circuit for switching the data path extending from a failure-DQ line to a DQ buffer, to the data path extending from a spare memory cell to the DQ buffer upon performing redundancy in the circuit shown in FIG. 7.

FIGS. 8 to 10 respectively show an example of the arrangement of the fuse box 33, an example of the arrangement of the fuse box 37-1, and an example of the arrangement of a data path switching circuit in the circuit shown in FIG. 7.

As shown in FIG. 8, the fuse box 33 is constituted by fuse circuits 33a to 33e. Each of the fuse circuits 33a to 33e comprises fuse elements F1 and F2, P-channel MOS transistors Q1 to Q4, N-channel MOS transistors Q5 and Q6, inverter circuits INV1 to INV4, AND gates 23 and 24, an OR gate 25, and the like.

Although FIG. 8 shows the circuit arrangement of the fuse circuit 33a in detail, and shows the fuse circuits 33b to 33e as blocks, the fuse circuits 33b to 33e also have substantially the same circuit arrangement as that of the fuse circuit 33a.

The fuse circuits 33a to 33e receive a signal BPRST, and 1-bit signals A0 and /A0 to A4 and /A4 of a column address, respectively.

Output signals B0 to B4 from the fuse circuits 33a to 33e are supplied to an AND gate 38, which outputs a signal RDQ0.

The fuse boxes 34 to 36 have substantially the same circuit arrangement as that of the fuse box 33. The fuse boxes 34 to 36 output signals RDQ1 to RDQ3.

FIG. 9 shows an example of the arrangement of the fuse box 37-1 in the circuit shown in FIG. 7. The fuse box 37-1 is constituted by fuse circuits 37-1a to 37-1d.

Each fuse circuit has the same arrangement as that of the circuit shown in FIG. 5. The fuse circuit 37-1a comprises a fuse element F3, P-channel MOS transistors Q7 and Q8, an N-channel MOS transistor Q9, inverter circuits INV5 and INV6, an AND gate 27, and the like.

Output signals FBMTC0 to FBMTC3 from the fuse circuits 37-1a to 37-1d are supplied to an AND gate 38. The data path is switched by an output signal SR from the AND gate 38 and a signal SN prepared by inverting this signal SR by an inverter circuit 39.

FIG. 10 shows a simplified circuit of switching the data path, which is arranged for each over-laid DQ line 15a. This circuit is constituted by clocked inverter circuits 40 and 41 and an inverter circuit 42.

The input terminal of the clocked inverter circuit 40 is connected to the over-laid DQ line 15a, and its clock input terminal receives the output signal SN from the circuit shown in FIG. 9.

The input terminal of the clocked inverter circuit 41 is connected to the spare DQ line 15c, and its clock input terminal receives the signal SR. The output terminals of the clocked inverter circuits 40 and 41 are connected to the input terminal of the inverter 42, and the output terminal of the inverter 42 is connected to the input terminal of the DQ buffer 17.

The clocked inverter circuit 40 operates as an inverter circuit when the signal SN is at "H" level, and its output terminal is in a high-impedance state when the signal SN is at "L" level. The clocked inverter circuit 41 operates as an inverter circuit when the signal SR is at "H" level, and its output terminal is in a high-impedance state when the signal SR is at "L" level.

When an input address does not coincide with the respective bits of the fuse box 20, a signal on the over-laid DQ line 15a is supplied to the DQ buffer 17 via the clocked inverter circuit 40 and the inverter circuit 42.

When the input address coincides with the respective bits of the fuse box 20, a signal on the spare over-laid DQ line 15c is supplied to the DQ buffer 17 via the clocked inverter circuit 41 and the inverter circuit 42.

According to the arrangement and method, since replacement is performed at only one I/O where a failure has occurred, remedy can be efficiently performed even for a larger number of bits. The spare memory cell, the spare sense amplifier circuit 13c, the spare column switch 14c, and the spare DQ lines 15c are common to the respective I/Os, and need not be arranged for each I/O, contributing to high integration.

Since spare replacement can be independently performed by the four spare sense amplifiers in the sense amplifier circuit 13c for sense amplifiers belonging to different I/Os, more efficient replacement can be performed.

Figure 11:
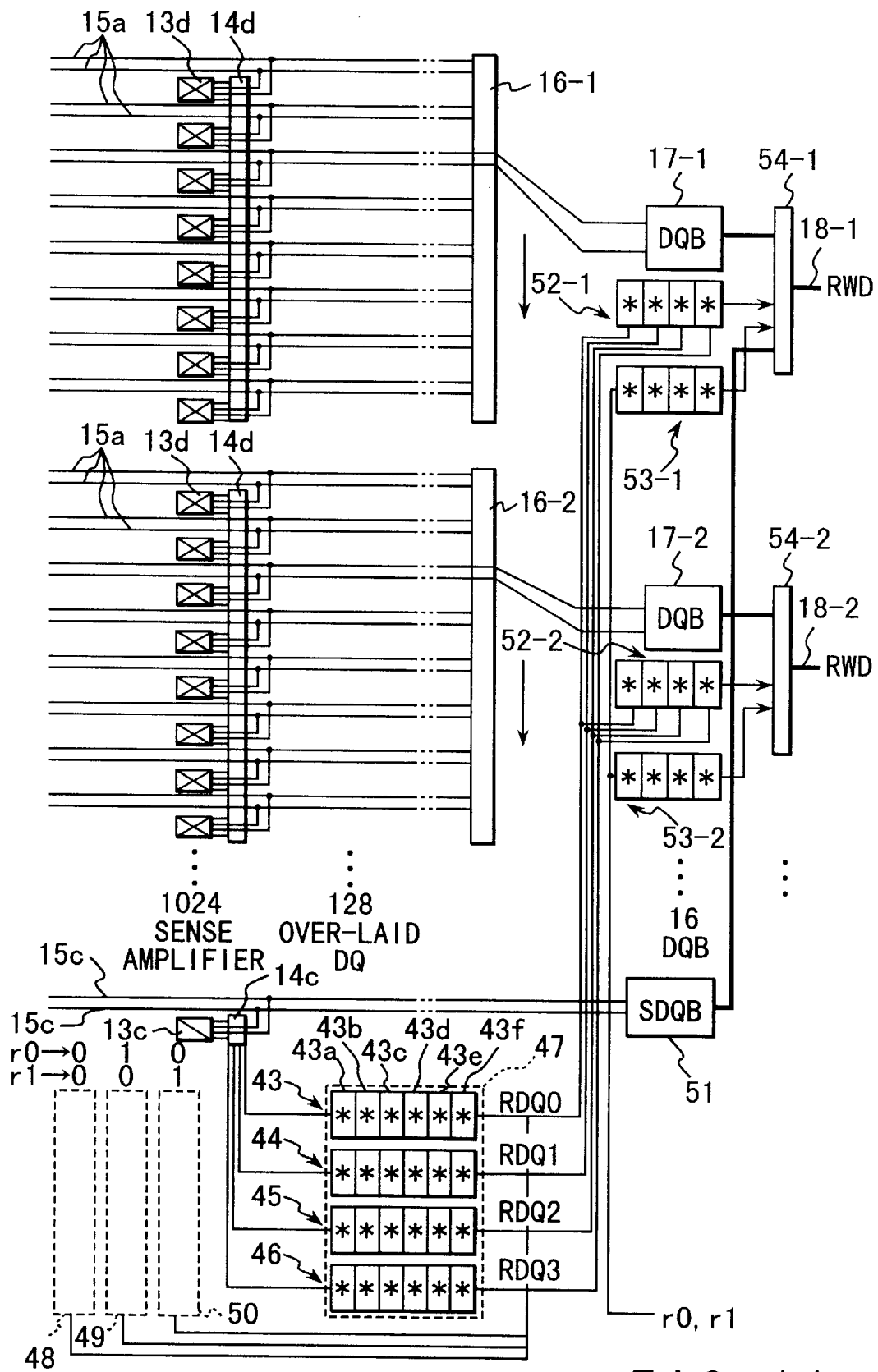
FIG. 11 is a circuit diagram schematically showing only an extracted portion related to decoding by a column address signal in a multi-bit memory in order to explain a semiconductor memory device according to the third embodiment of the present invention.

FIG. 11 is a circuit diagram for explaining the redundancy system and method of a semiconductor memory device according to the third embodiment of the present invention, and shows the column arrangement of a memory cell array in detail.

More specifically, in the redundancy system and method of the semiconductor memory device according to the first and second embodiments described above, all the spare DQ lines are commonly connected to the DQ decoders.

For this reason, the capacity of the spare line is much larger than that of the regular DQ line, and the data transfer speed may be unbalanced. As shown in FIG. 1, the memory is constituted by n memory cell arrays, the DQ lines 15 are commonly arranged in the memory cell arrays, and spare replacement is simultaneously performed at the same column address in all the cell arrays.

As a result, even if a memory cell array which need not actually use a spare DQ line is accessed, the DQ line is undesirably replaced with the spare because of no means of discriminating this memory cell array from another.

In the third embodiment to be described below, these problems are solved to further increase the remedy efficiency.

One memory cell array has 128 pairs of over-laid DQ lines 15a, and each pair of over-laid DQ lines 15a have a sense amplifier circuit 13d.

Each sense amplifier circuit 13d comprises eight sense amplifiers, and a total of 1,024 sense amplifiers exist. Eight pairs of over-laid DQ lines 15a constitute one I/O, and a total of 16 I/Os exist.

The number of memory cell arrays independently activated is four, and r0 and r1 are assigned as column address bits for discriminating the memory cell arrays from each other.

Since 8×8=64 sense amplifiers are assigned for one I/O, designation of these sense amplifiers requires 6 bits, and a fuse box having a 6-bit fuse circuit is necessary for replacement of one column.

The number of spare sense amplifiers in a spare sense amplifier circuit 13c is four, and four fuse boxes are required to replace arbitrary columns with these spare sense amplifiers.

For this reason, a fuse block 47 constituted by four fuse boxes 43 to 46 each having a 6-bit fuse circuit is arranged. One bit of each of the fuse boxes 43 to 46 is a bit representing whether a spare is used in a memory cell array corresponding to each of the fuse boxes 43 to 46.

Four memory cell arrays which can be independently activated are prepared. To independently allow replacement with a spare sense amplifier in each memory cell array, fuse blocks 48, 49, and 50 similar to the above one are arranged for the respective memory cell arrays.

In this case, r0=0 and r1=0 are assigned as row address bits to the fuse block 48, and r0=1 and r1=0 are assigned as row address bits to the fuse block 49.

r0=0 and r1=1 are assigned as row address bits to the fuse block 50, and r0=1 and r1=1 are assigned as row address bits to the fuse block 47.

A spare sense amplifier is connected to spare DQ lines 15c in accordance with signals RDQ0 to RDQ3 from a fuse box having bits which coincide with 6 bits of a column address sent to a selected memory cell array, and data on the spare DQ lines 15c are amplified by a spare DQ buffer (SDQB) 51.

4-bit fuse boxes 52-1, 52-2, . . . are arranged in correspondence with regular DQ buffers 17-1, 17-2, . . . . The fuse boxes 52-1, 52-2, . . . represent I/Os at which the four spare sense amplifiers are used.

When a spare sense amplifier represented by one of these fuse bits is used, a spare may be used at the I/O, which is not confirmed unless an activated memory cell array is known.

To represent a specific I/O which uses a spare when a certain memory cell array is selected, fuse boxes corresponding to the number of memory cell arrays, in this case, 4-bit fuse boxes 53-1, 53-2, . . . are further arranged in the DQ buffers 17-1, 17-2, . . . .

When a signal generated by 2 bits r0 and r1 of the row address representing an activated memory cell array coincides with any of four fuse bits, if a failure-column of this I/O is selected, a spare is used at the I/O.

More specifically, a signal from a fuse indicating a spare sense amplifier, and a signal from a fuse indicating an activated cell array simultaneously access a DQ buffer, and the spare is selected at the I/O.

The spare is selected by switching the data transfer path extending from the DQ buffer 17-1, 17-2, . . . to the data transfer path extending from the spare DQ buffer 51 by a data path switching circuit 54-1, 54-2, . . . .

To minimize the difference in load capacity between the spare DQ line 15c and the regular DQ line 15a, switching to the spare is performed between the input/output data paths of the DQ buffer 17-1, 17-2, . . . serving as a data sense buffer and the spare DQ buffer 51.

A change in load of each of RWD lines 18-1, 18-2, . . . at each I/O between a case using the spare and a normal case can be adjusted by the driving ability of the spare DQ buffer 51.

Figure 12:
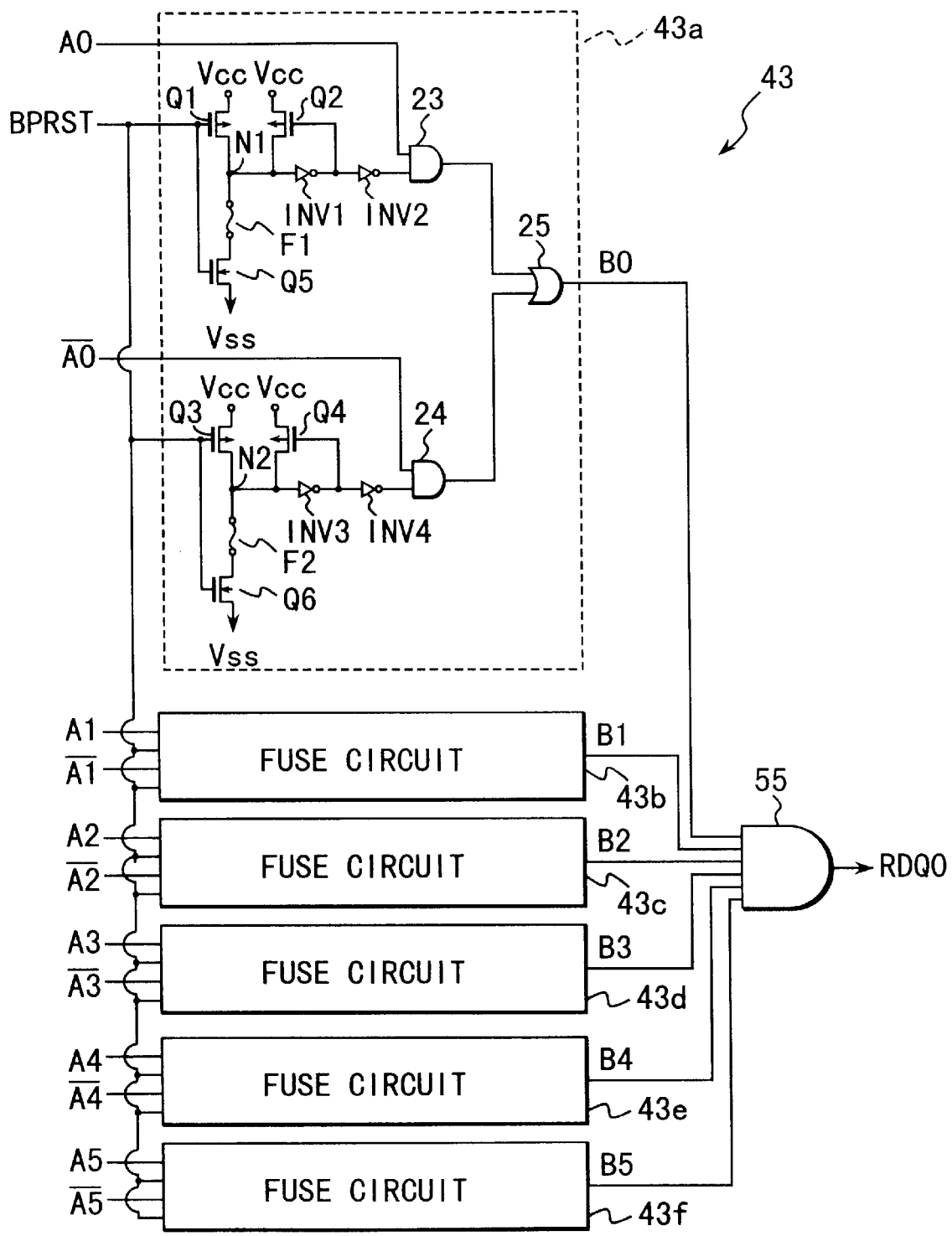
FIG. 12 is a circuit diagram showing a fuse box for selecting a sense amplifier in a sense amplifier circuit belonging to each I/O for each memory cell array which can be independently activated in the circuit shown in FIG. 11.

FIG. 12 shows an example of the arrangement of the fuse box 43 in the circuit shown in FIG. 11.

The fuse box 43 is constituted by fuse circuits 43a to 43f, and each of the fuse circuits 43a to 43f comprises fuse elements F1 and F2, P-channel MOS transistors Q1 to Q4, N-channel MOS transistors Q5 and Q6, inverter circuits INV1 to INV4, AND gates 23 and 24, an OR gate 25, and the like.

Although FIG. 12 shows the circuit arrangement of the fuse circuit 43a in detail, and shows the fuse circuits 43b to 43f as blocks, the fuse circuits 43b to 43f also have substantially the same circuit arrangement as that of the fuse circuit 43a.

The fuse circuits 43a to 43f receive a signal BPRST, and 1-bit signals A0 and /A0 to A5 and /A5 of a column address, respectively.

Output signals B0 to B5 from the fuse circuits 43a to 43f are supplied to an AND gate 55, which outputs a signal RDQ0.

The fuse boxes 44 to 46 have substantially the same circuit arrangement as that of the fuse box 43. The fuse boxes 44 to 46 similarly output signals RDQ1 to RDQ3. The fuse blocks 48 to 50 also have the same arrangement as that of the block 47 constituted by the fuse blocks 48 to 50.

FIG. 13 shows the fuse boxes 52-1 and 53-1 in the circuit shown in FIG. 11, and a circuit portion related to them. The signals RDQ0 to RDQ3 corresponding to the four sense amplifiers which are output from the fuse blocks 47 to 50 are supplied to OR gates 56-1 to 56-4 for the respective sense amplifiers.

The OR gate 56-1 receives a signal RDQ0-47 output from the block 47, a signal RDQ0-48 output from the block 48, a signal RDQ0-49 output from the block 49, and a signal RDQ0-50 output from the block 50. An output signal from the OR gate 56-1 is supplied to an fuse block 47 in a fuse circuit 52-1a.

The OR gate 56-2 receives signals RDQ1-47, RDQ1-48, RDQ1-49, and RDQ1-50, and an output signal from the OR gate 56-2 is supplied to an AND gate in a fuse circuit 52-1b.

The OR gate 56-3 receives signals RDQ2-47, RDQ2-48, RDQ2-49, and RDQ2-50, and an output signal from the OR gate 56-3 is supplied to an AND gate in a fuse circuit 52-1c.

The OR gate 56-4 receives signals RDQ3-47, RDQ3-48, RDQ3-49, and RDQ3-50, and an output signal from the OR gate 56-4 is supplied to an AND gate in a fuse circuit 52-1d.

Output signals FBMTC0 to FBMTC3 from the fuse circuits 52-1a to 52-1d are supplied to an OR gate 58.

AND gates 57-1 to 57-4 are arranged to identify the blocks of the row of a memory cell array. The AND gates 57-1 to 57-4 respectively receive row addresses r0 and r1 of (0,0), (1,0), (0,1), and (1,1).

Output signals from the AND gates 57-1 to 57-4 are supplied to AND gates 27 in fuse circuits 53-1a to 53-1d. Output signals RBMTC0 to RBMTC3 from the fuse circuits 53-1a to 53-1d are supplied to an OR gate 59.

Output signals from the OR gates 58 and 59 are supplied to an AND gate 60. The data path is switched by an output signal SR from the AND gate 60 and a signal SN prepared by inverting this signal SR by an inverter circuit 61.

Although FIG. 13 exemplifies the fuse boxes 52-1 and 53-1, the fuse boxes 52-2, . . . and 53-2, . . . also have the same arrangement.

FIG. 14 shows the schematic arrangement of the data path switching circuit 54-1 in FIG. 11. This circuit is constituted by clocked inverter circuits 62 and 63 and an inverter circuit 64.

The input terminal of the clocked inverter circuit 62 is connected to the output terminal of the DQ buffer 17, and the clock input terminal of the clocked inverter circuit 62 receives the output signal SN from the circuit shown in FIG. 13.

The input terminal of the clocked inverter circuit 63 is connected to the output terminal of the spare DQ buffer 51, and the clock input terminal of the clocked inverter circuit 63 receives the signal SR. The output terminals of the clocked inverter circuits 62 and 63 are connected to the input terminal of the inverter 64, and the output terminal of the inverter 64 is connected to the RWD bus 18.

The clocked inverter circuit 62 operates as an inverter circuit when the signal SN is at "H" level, and its output terminal is in a high-impedance state when the signal SN is at "L" level. The clocked inverter circuit 63 operates as an inverter circuit when the signal SR is at "H" level, and its output terminal is in a high-impedance state when the signal SR is at "L" level.

With this arrangement, since replacement is performed at only one I/O where a failure has occurred, remedy can be efficiently performed even for a larger number of bits. The spare memory cell, the spare sense amplifier circuit 13c, the spare column switch 14c, and the spare DQ lines 15c are common to the respective I/Os, and need not be arranged for each I/O, contributing to high integration.

Since spare replacement for sense amplifiers belonging to different I/Os can be independently performed by the four spare sense amplifiers in the sense amplifier circuit 13c, more efficient replacement can be performed.

Since the spare DQ buffer 51 is arranged, and switching to the spare is performed between the input/output data paths of the DQ buffer 17-1, 17-2, . . . and the spare DQ buffer 51, the difference in load capacity between the spare DQ line 15c and the regular DQ line 15a can be decreased to make the data transfer speed constant.

When a spare is requested to be used at the same column address of different I/Os in one memory cell array, i.e., the same bit is selected in both the spare sense amplifier selection fuse bits and the cell array selection fuse bits at two or more I/Os, the plurality of I/Os simultaneously select the spare DQ buffer. Except for this case, i.e., except for the case wherein the spare must be simultaneously used in two or more I/Os, the spare can be replaced from an arbitrary position to a column position on the memory cell array.

The above-described methods in FIGS. 3, 7, and 11 will be generalized to formulate a redundancy system and method using different spares for respective I/Os in a multi-bit memory, and an address identification system and method.

The address space of data subjected to redundancy will be defined. FIG. 15 shows the address space representing the group of memory cells or data to be replaced with a spare at once in an actual memory.

If the address of the address group is designated, a group serving as the replacement unit at each I/O can be designated. More specifically, this group is one pair of DQ lines designated by 3 column address bits in FIG. 3, one sense amplifier common to the cell arrays which is designated by 5 column address bits in FIG. 7, or one sense amplifier for each cell array which is designated by 2 row address bits and 6 column address bits in FIG. 11.

The I/O axis of the address space is the group of data which cannot designate a definite address, and is the feature of the multi-bit memory.

X represents a vector indicating a position in the address space excepting the I/O axis. For example, circles 100 to 103 in FIG. 15 are addresses subjected to replacement at each I/O, and arrows represent vectors X.

Representing the coordinate of the I/O axis by z, since z is not identified by designating X, z is identified by an address other than the one supplied to the system, i.e., outside the system.

The address fuse box will be defined. As shown in FIG. 16, an address fuse box fb outputs "0" or "1" upon reception of the vector X.

More specifically, the fuse box fb determines whether the vector X coincides with an address programmed in the fuse box, and outputs the result. The fuse box fb corresponds to the fuse box 20 formed of 3 fuse bits in FIG. 3, the fuse boxes 33 to 36 each formed of 5 fuse bits in FIG. 7, and the fuse boxes 43 to 46 each formed of 6 fuse bits in FIG. 11. The fuse box space will be defined.

The fuse box space is constituted by fuse boxes corresponding to the number of spares which can be independently replaced, and characterized by a manner of setting the coordinate for designating each fuse box.

FIG. 17 shows an example of the fuse box space constituted by 352 fuse boxes. Three types of coordinates are assumed and are different from normal coordinates. The coordinate axes are formed of the groups of unit vectors, and defined by $\{e(1)i1\}$, $\{e(2)i2\}$, and $\{e(3)i3\}$.

More specifically, since the axis $\{e(1)i1\}$ is constituted by a four-layered fuse box array in the example of FIG. 13, it is defined by a four-dimensional unit vector. Assuming the layers as the first, second, third, and fourth layers from the right, these layers are respectively represented by [1,0,0,0], [0,1,0,0], [0,0,1,0], and [0,0,0,1].

These are converted into signs $e(1)1$, $e(1)2$, $e(1)3$, and $e(1)4$. Other coordinates can be similarly represented.

$\{e(1)i1\}$, $\{e(2)i2\}$, and $\{e(3)i3\}$ are defined by four-dimensional, eight-dimensional, and 11-dimensional unit vectors. If one unit vector is designated from each coordinate axis, a given fuse box can be designated and specified in the fuse box space.

Various manners of setting the coordinate axis are conceivable, but the one in which an actual fuse alignment and the like are intuitively comprehensive is adopted. FIG. 17 shows an example.

The following description is related to another example of the manner of setting the coordinate using the smallest total number of fuses though the fuse box layout is less intuitively comprehensive than the example of FIG. 17. Factorizing the total fuse box number of 352 into prime factors, 352= 2·2·2·2·2·11. Coordinate axes corresponding to the number of primes appearing as prime factors, and unit vectors using the respective primes as dimensions are used.

More specifically, the fuse box space can be expressed by a total of six coordinates, i.e., five coordinates consisting of two-dimensional unit vectors, and one coordinate consisting of a 11-dimensional unit vector. By designating one unit vector from each coordinate axis, a specific fuse box can be specified.

The total number of unit vectors of the above-described example used to designate all the fuse boxes in FIG. 17 is 23 in the former case, and 21 in the latter case.

Assuming that the coordinate axis of the fuse box space is $\{e(m)im\}$ (m=1, 2, ..., n), and the dimension of each unit vector is dim(e(m)im)=k(m), im takes a value of 1, 2, ..., k(m), and the total number of fuse boxes of the fuse box space is $k(1) \times k(2) \times ... \times k(n)$.

When a given fuse box is designated by Y=[e(m)im] (assume that, in { }, im changes with m being fixed, and in [ ], m changes to determine im for each m), and the function of this fuse box is given by fbY, for the coordinate X of the data address space fbY(X)=0 or 1 fbY(X), fbY(X')=0

That is, one fuse box outputs "1" for only one X. This means that only one fuse box is programmed and designated for each X in the fuse box space, and the programmed fuse box is caused to output "1" (replaced with a spare), or no fuse box is designated.

A method of designating an I/O to which X assigned to the fuse box space corresponds, i.e., designating the coordinate z identified only outside the system will be described.

According to a method of identifying an address space coordinates (z,X) assigned to the fuse box space, a fixed vector using "0" and "1" as an element is generated for each z as f1z, f2z, ..., fmz, ..., fnz. The dimension of fmz is dim(fmz)=dim(e(m)im)=k(m). This will be referred to as an identification space.

The fixed vector of this identification space is generated as follows to attain the method of identifying z.

Since fbY(X)=1 yields Y=[e(m)im] for each (z,X), "1" is substituted into k(m) elements of fmz so as to establish fmz·e(m)im=1 for each m.

The identification space is constituted by k(1)+k(2)+ ... +k(n) elements for each z, i.e., each I/O. A fuse box belonging to a certain I/O can be identified by designating a smaller number of elements than the number of elements of the fuse box space.

A detailed example of how to define the identification space will be described with reference to the example of FIG. 17. In FIG. 17, assume that three coordinates z are assigned to the address space of FIG. 15.

In FIG. 17, fuse boxes 104 and 105 are programmed for addresses belonging to I/O 2, i.e., z=2, while a fuse box 106 is programmed for an address belonging to I/O 1, i.e., z=1.

The coordinates of the fuse boxes 104 and 105 for z=2 are [e(1)2, e(2)1, e(3)7], and [e(1)4, e(2)1, e(3)5], respectively. The coordinate of the fuse box 106 for z=1 is [e(1)2, e(2)1, e(3)2]. Detailed unit vectors are as follows.

e(1)2=[0,1,0,0]
e(2)1=[1,0,0,0,0,0,0,0]
e(3)7=[0,0,0,0,0,0,1,0,0,0,0]
e(1)4=[0,0,0,1]

e(2)5=[0,0,0,0,1,0,0,0,0,0]
e(3)2=[0,1,0,0,0,0,0,0,0,0]

Figures 18A, 18B:
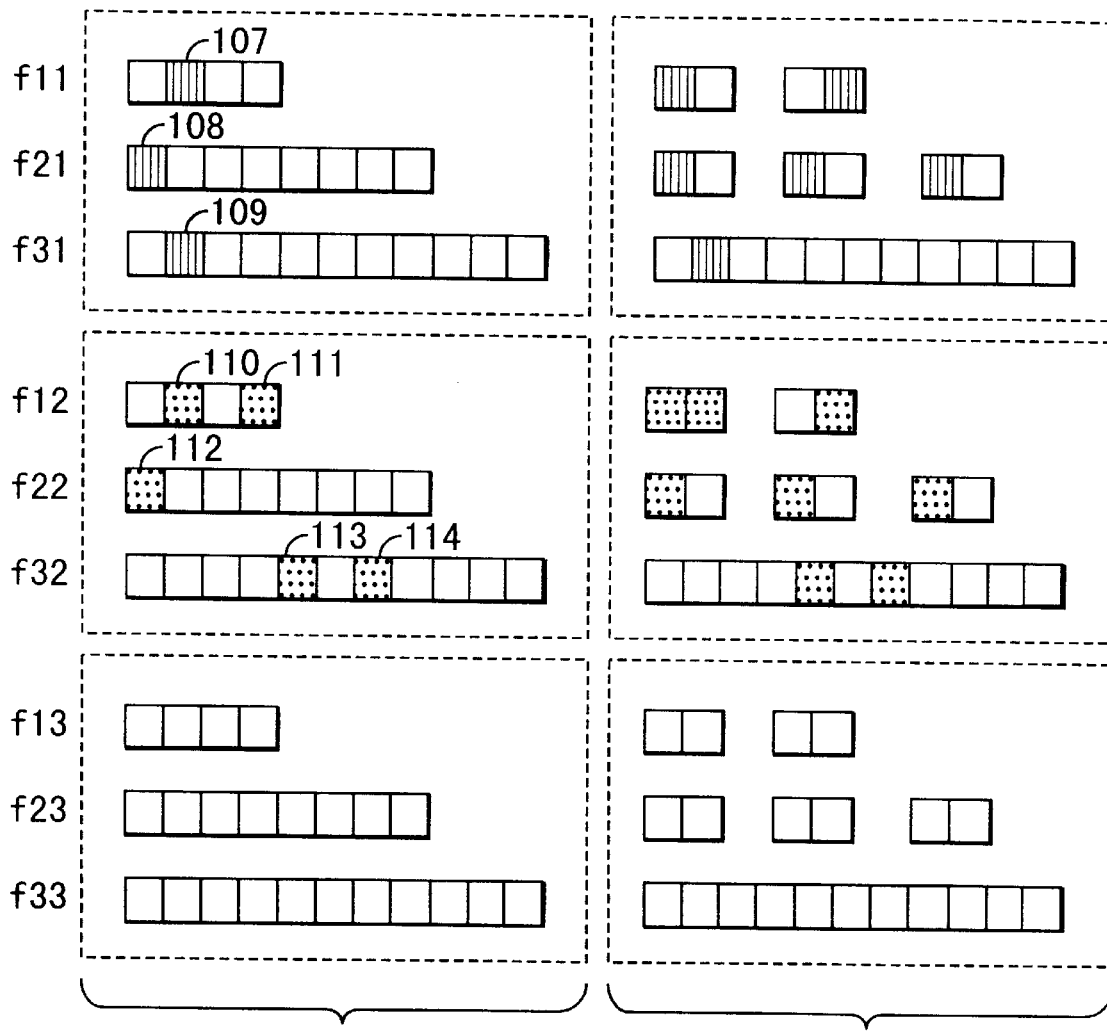
FIG. 18A is an explanatory view of the fixed vector of the identification space corresponding to FIG. 17.
FIG. 18B is an explanatory view of the fixed vector of the identification space corresponding to FIG. 17.

For z=1, if fm1 is constituted such that fm1·e(m)im=1 is satisfied for [e(1)2, e(2)1, e(3)2], the vectors in FIGS. 18A and 18B are obtained. For z=2, if fm2 is constituted such that fm2·e(m)im=1 is satisfied for [e(1)2, e(2)1, e(3)7] and [e(1)4, e(2)1, e(3)5], the vectors in FIGS. 18A and 18B are obtained.

In this example, fm3 is always "0" because of no assignment. Vertically striped fuse bits 107 to 109 and dotted fuse bits 110 to 114 in FIG. 18A represent the element "1" of the fixed vector of the identification space.

The method of expressing the fuse box space with six coordinates has been described with reference to FIG. 17. FIG. 18B shows a corresponding identification space.

A detailed element of the fixed vector of the identification space is a fuse bit belonging to each DQ buffer in FIGS. 3, 7, and 11.

In FIG. 3, the fuse box space is expressed by a one-dimensional unit vector, i.e., "1", and the identification space is also one-dimensional. That is, the identification space represents whether each of the fuse boxes 21-1, 21-2, . . . is used by z for a certain address.

In FIG. 7, the fuse box space is expressed by a four-dimensional unit vector. The identification space is also defined by a four-dimensional fixed vector.

In FIG. 11, the fuse box space is expressed by two pairs of four-dimensional unit vectors. Since the number of fuse boxes is 16, the fuse box space can also be expressed by four pairs of two-dimensional unit vectors consisting of 2·2·2·2 as a result of factorization into prime factors. However, both of the unit vector numbers are 8, so that more intuitively comprehensive unit vectors are employed. The identification space is defined by two fixed vectors having four-dimensional z.

When the fixed vector of the identification space exists, a certain address is given to the fuse box space, and the coordinates of a fuse box which outputs "1" are known, the following method of identifying z of this address is used. By this method, an I/O subjected to spare replacement can be obtained.

For a given address X, Y=[e(m)im] is determined if fbY(X)=1 holds. This Y is functioned with the fixed vector of the identification space to perform inner product and AND calculation, and search for z which yields "1". That is, the fixed vector is generated such that z which satisfies $$f1z \cdot e(1)i1 \cap f2z \cdot e(2)i2 \cap \ldots \cap fmz \cdot e(m)im \cap \ldots fnz \cdot e(n)in = 1$$

is in one-to-one correspondence with one Y that yields fbY(X)=1. Therefore, this z is z to which the address belongs.

More specifically, as described above with reference to FIG. 11, this calculation corresponds to the operation in which the signals RDQ0 to RDQ3 from the fuse boxes 43 to 46 are output to the fuse bits of each of DQ buffers 17-1, 17-2, . . . , if corresponding fuse bits are programmed, the DQ buffer sends a coincidence signal, the AND of this coincidence signal is calculated, and the spare is used at an I/O where this AND is established.

The above description is associated with the general method of giving the address identification system information on I/Os which cannot be identified by only an address supplied to the system in a multi-bit parallel input/output memory or the like. According to this method, spare replacement can be efficiently performed in the multi-bit memory.

FIG. 19 is a block diagram showing the schematic arrangement of an extracted portion when the above-described memory chip is incorporated in the system. A memory chip 100 has basically the same arrangement as that described in the above embodiments.

The memory chip 100 is connected to a CPU 102 via a bus (address bus, command bus, or data bus) 101, receives an address and a command from the CPU 102, and exchanges data with the CPU 102.

The memory chip 100 comprises a memory cell array 103, a read/write circuit 104, an input circuit 105, an output circuit 106, a synchronous circuit 107, a clock buffer 108, a fuse program circuit 109, and the like.

A clock signal CK output from the CPU 102 is input to the clock buffer 108, and an output from the clock buffer 108 is used as an internal clock CLK of the memory chip 100.

The internal clock CLK is supplied to the read/write circuit 104 and the synchronous circuit 107. The read/write circuit 104 receives an address and a command from the CPU 102 via the bus 101, and reads/writes data from/in the memory cell array 103 in synchronism with the internal clock CLK.

The synchronous circuit 107 eliminates the skew between the clock signal CK and the internal clock signal CLK, and supplies an internal clock signal CK' from which the skew is eliminated to the input circuit 105 and the output circuit 106. These circuits 105 and 106 operate in synchronism with the signal CK'.

The fuse program circuit 109 receives a fuse program signal FP from the CPU 102, and controls the read/write circuit 104 to switch the data path extending from a failure-DQ line to a corresponding DQ buffer to the data path extending from a spare DQ line to the DQ buffer.

In the above arrangement, when a failure occurs in the memory chip (memory cell) 100 due to a deterioration over time or the like, the CPU 102 writes data in each memory cell of the memory cell array 103, and reads out the data to perform verification.

In the case of incoincidence, the CPU 102 supplies the fuse program signal FP to the fuse program circuit 109. The fuse program circuit 109 programs the failure-address in the fuse box of the above embodiments. The data path extending from the failure-DQ line to a corresponding DQ buffer is switched to the data path extending from the spare DQ line to the buffer to replace the memory cell having the failure with a spare memory cell.

With this processing, even when a failure occurs in the memory cell due to a deterioration over time or the like upon incorporating the memory cell into the system, the memory cell can be remedied without impairing the system itself.

FIG. 20 is a flow chart for explaining the redundancy method in the memory system shown in FIG. 19.

The system power source is turned on (step 1). The CPU 102 provides the memory chip 100 with an address and data, and writes the data into the memory (step 2).

The CPU 102 provides the memory chip 100 with the same address, and reads the data from the memory chip 100 from the written address (step 3). The readout data is compared with the write data (step 4).

When both the data coincide with each other, whether all addresses are tested is checked (step 5). If NO in step 5, the address is changed (step 7), and the operation from steps 2 to 6 is repeatedly executed.

If the write data and the readout data are determined to coincide with each other at all the addresses in step 5, the memory chip 100 is determined to correctly operate, and the test ends (step 7).

If NO in step 4, the number of fuse boxes to be used is checked (step 8), and whether a usable fuse exists is determined (step 9).

If YES in step 9, the CPU 102 outputs the fuse program signal FP and supplies it to the fuse program circuit 109 (step 10). The failure-address is programmed with the fuse (step 11).

Then, the flow returns to step 6 to change the address, and further returns to step 2 to repeatedly execute the above-described operation. If NO in step 9, the CPU 102 determines a memory failure to stop the system (step 12).

According to this method, even if a failure is caused by a deterioration over time or the like after incorporating the memory chip 100 into the system, the memory chip 100 can be easily remedied if a usable fuse (spare memory cell) exists.

Since the test is performed while checking the number of usable fuse boxes, when no usable fuse box exists, a wasteful test can be stopped.

The case wherein the CPU 102 supplies the fuse program signal FP as an independent signal to the fuse program circuit 109 via a signal line in the system shown in FIG. 19 has been exemplified. However, the CPU 102 may input a command via the bus 101.

As has been described above, according to the present invention, the semiconductor memory device in which a failure can be efficiently remedied is provided. In addition, the redundancy system and method capable of efficiently remedying a failure even for a larger number of bits are provided.

Further, the address identification system and method capable of identifying an address in a multi-bit memory for each I/O, and efficiently performing spare replacement are provided.

Still further, the memory system and its redundancy method in which, even when a failure occurs in a memory cell due to a deterioration over time or the like upon incorporation into the system, the memory cell can be remedied are provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A semiconductor memory device comprising:

a plurality of memory cell arrays in which memory cells are laid out in a matrix form;

row decoders arranged in correspondence with said plurality of memory cell arrays to select a row of each of said memory cell arrays on the basis of a row address signal;

sense amplifier circuits arranged in correspondence with said plurality of memory cell arrays to receive data read out from memory cells on the row selected by said row decoders;

DQ lines which are arranged in correspondence with said sense amplifier circuits, and commonly used in said plurality of memory cell arrays;

column switches arranged in correspondence with said sense amplifier circuits to select sense amplifier circuits to be connected to said DQ lines on the basis of a column address signal;

a plurality of DQ decoders for performing a selection operation for said DQ lines on the basis of the column address signal for each I/O;

a plurality of DQ buffers arranged in correspondence with said DQ decoders to receive data on DQ lines selected by said DQ decoders for each I/O;

a spare DQ line commonly used by said DQ lines belonging to respective I/Os;

a spare sense amplifier circuit which receives data read out from a spare memory cell;

a spare column switch for selecting connection of said spare sense amplifier circuit to said spare DQ line;

first storage means for storing an address of a DQ line in which a failure has occurred; and second storage means, arranged for each I/O, for storing an I/O to which the failure-DQ line belongs, wherein, when the address stored in said first storage means is accessed, said DQ line belonging to the I/O stored in said second storage means and having the address stored in said first storage means, a sense amplifier circuit connected to said DQ line, and a column switch selecting said sense amplifier circuit are respectively replaced with said spare DQ line, said spare sense amplifier circuit, and said spare column switch, and said spare DQ line, said spare sense amplifier circuit, and said spare column switch are commonly used by said DQ lines belonging to respective I/Os.

2. A device according to claim 1, wherein said first storage means comprises a fuse circuit for storing information on the number of bits corresponding to the number of DQ lines belonging to each I/O.

3. A device according to claim 1, wherein said second storage means comprises a fuse circuit for storing 1-bit information.

4. A semiconductor memory device comprising:

a plurality of memory cell arrays in which memory cells are laid out in a matrix form;

row decoders arranged in correspondence with said plurality of memory cell arrays to select a row of each of said memory cell arrays on the basis of a row address signal;

sense amplifier circuits arranged in correspondence with said plurality of memory cell arrays to receive data read out from memory cells on the row selected by said row decoders;

DQ lines which are arranged in correspondence with said sense amplifier circuits, and commonly used in said plurality of memory cell arrays;

column switches arranged in correspondence with said sense amplifier circuits to select sense amplifier circuits to be connected to said DQ lines on the basis of a column address signal;

a plurality of DQ decoders for performing a selection operation for said DQ lines on the basis of the column address signal for each I/O;

a plurality of DQ buffers arranged in correspondence with said DQ decoders to receive data on DQ lines selected by said DQ decoders for each I/O;

a spare DQ line commonly used by said DQ lines belonging to respective I/Os;

a spare sense amplifier circuit which receives data read out from a spare memory cell;

a spare column switch for selecting connection of said spare sense amplifier circuit to said spare DQ line;

first storage means for storing an address of a DQ line in which a failure has occurred;

second storage means, arranged for each I/O, for storing an I/O to which the failure-DQ line belongs; and switching means for switching a data path extending to a DQ buffer corresponding to said failure-DQ line from said failure-DQ line belonging to said I/O stored in said second storage means and having the address stored in said first storage means, to a data path extending from said spare DQ line to said DQ buffer corresponding to said failure-DQ line when the address stored in said first storage means is accessed.

5. A device according to claim 4, wherein said first storage means comprises a fuse circuit for storing information on the number of bits corresponding to the number of DQ lines belonging to each I/O.

6. A device according to claim 4, wherein said second storage means comprises a fuse circuit for storing 1-bit information.

7. A semiconductor memory device comprising:

a plurality of memory cell arrays in which memory cells are laid out in a matrix form;

row decoders arranged in correspondence with said plurality of memory cell arrays to select a row of each of said memory cell arrays on the basis of a row address signal;

sense amplifier circuits arranged in correspondence with said plurality of memory cell arrays to receive data read out from memory cells on the row selected by said row decoders;

DQ lines which are arranged in correspondence with said sense amplifier circuits, and commonly used in said plurality of memory cell arrays;

column switches arranged in correspondence with said sense amplifier circuits to select sense amplifier circuits to be connected to said DQ lines on the basis of a column address signal;

a plurality of DQ decoders for performing a selection operation for said DQ lines on the basis of the column address signal for each I/O;

a plurality of DQ buffers arranged in correspondence with said DQ decoders to receive data on DQ lines selected by said DQ decoders for each I/O;

a spare DQ line commonly used by said DQ lines belonging to respective I/Os;

a plurality of spare sense amplifier circuits which receive data read out from a spare memory cell;

a spare column switch for selecting connection of said plurality of spare sense amplifier circuits to said spare DQ line;

first detection means, arranged in correspondence with said plurality of spare sense amplifier circuits, for storing an address of a DQ line in which a failure has occurred, and detecting access to the stored address;

second detection means for storing, for each I/O, information on whether a DQ line having the accessed address must be replaced, and when said first detection means detects the access to the address, detecting, for each I/O, said DQ line having the accessed address which must be replaced on the basis of the information; and switching means for switching a data path extending to a DQ buffer corresponding to said DQ line which must be replaced from said DQ line which must be replaced and detected by said second detection means, to a data path extending from said spare DQ line to said DQ buffer corresponding to said DQ line which must be replaced for each of said spare sense amplifier circuits when said second detection means detects that said DQ line must be replaced.

8. A device according to claim 7, wherein said first detection means comprises a fuse circuit for storing information on the number of bits corresponding to the number of DQ lines belonging to each I/O.

9. A device according to claim 7, wherein said second detection means comprises a fuse circuit for storing information on the number of bits corresponding to said plurality of spare sense amplifier circuits.

10. A semiconductor memory device comprising:

a plurality of memory cell arrays in which memory cells are laid out in a matrix form;

row decoders arranged in correspondence with said plurality of memory cell arrays to select a row of each of said memory cell arrays on the basis of a row address signal;

sense amplifier circuits arranged in correspondence with said plurality of memory cell arrays to receive data read out from memory cells on the row selected by said row decoders;

DQ lines which are arranged in correspondence with said sense amplifier circuits, and commonly used in said plurality of memory cell arrays;

column switches arranged in correspondence with said sense amplifier circuits to select sense amplifier circuits to be connected to said DQ lines on the basis of a column address signal;

a plurality of DQ decoders for performing a selection operation for said DQ lines on the basis of the column address signal for each I/O;

a plurality of DQ buffers arranged in correspondence with said DQ decoders to receive data on DQ lines selected by said DQ decoders for each I/O;

a spare DQ line commonly used by said DQ lines belonging to respective I/Os;

a plurality of spare sense amplifier circuits which receive data read out from a spare memory cell;

a spare column switch for selecting connection of said plurality of spare sense amplifier circuits to said spare DQ line;

first detection means, arranged in correspondence with said plurality of spare sense amplifier circuits, for storing an address of a DQ line in which a failure has occurred, and detecting access to the stored address;

second detection means for storing, for each I/O, information on whether a DQ line having the accessed address must be replaced, and when said first detection means detects the access to the address, detecting, for each I/O, said DQ line having the accessed address which must be replaced on the basis of the information;

third detection means for detecting access to a memory cell array to be replaced; and switching means for switching a data path extending to a DQ buffer corresponding to said DQ line detected by said second detection means from said DQ line of said memory cell array to be replaced that is detected by said second detection means, to a data path extending from said spare DQ line to said DQ buffer corresponding to said DQ line which must be replaced for each of said spare sense amplifier circuits when said second detection means detects said DQ line, and said third detection means detects the access.

11. A device according to claim 10, wherein said first detection means comprises a fuse circuit for storing information on the number of bits corresponding to the number of DQ lines belonging to each I/O.

12. A device according to claim 10, wherein said second detection means comprises a fuse circuit for storing information on the number of bits corresponding to said plurality of spare sense amplifier circuits.

13. A device according to claim 10, wherein said third detection means comprises a fuse circuit storing information on the number of bits corresponding to the number of memory cell arrays independently activated.

* * * * *